(12) United States Patent
Yoo et al.

(10) Patent No.: US 11,989,602 B2
(45) Date of Patent: May 21, 2024

(54) DISPLAY DEVICE AND SENSING SYSTEM INCLUDING THE SAME

(71) Applicant: Samsung Display Co., Ltd., Yongin-Si (KR)

(72) Inventors: Gi Na Yoo, Cheonan-si (KR); Ju Yeon Kim, Asan-si (KR); Won Sang Park, Yongin-si (KR); Chang Woo Shim, Cheonan-si (KR); Seong Jun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 148 days.

(21) Appl. No.: 17/687,955

(22) Filed: Mar. 7, 2022

(65) Prior Publication Data

US 2023/0051888 A1 Feb. 16, 2023

(30) Foreign Application Priority Data

Aug. 13, 2021 (KR) .................. 10-2021-0107344

(51) Int. Cl.
| | |
|---|---|
| *G06K 19/06* | (2006.01) |
| *G06K 19/077* | (2006.01) |
| *G09G 3/3291* | (2016.01) |
| *H10K 59/38* | (2023.01) |
| *H10K 59/40* | (2023.01) |
| *H10K 59/65* | (2023.01) |

(52) U.S. Cl.
CPC .... *G06K 19/06112* (2013.01); *G06K 19/0614* (2013.01); *G06K 19/07707* (2013.01); *G09G 3/3291* (2013.01); *H10K 59/38* (2023.02); *H10K 59/40* (2023.02); *H10K 59/65* (2023.02)

(58) Field of Classification Search
CPC ......... G06K 19/06112; G06K 19/0614; H10K 59/40; H10K 59/65
USPC ........................................................ 235/487
See application file for complete search history.

(56) References Cited

U.S. PATENT DOCUMENTS

| | | | | |
|---|---|---|---|---|
| 9,030,509 | B2* | 5/2015 | Yamaguchi | G06F 3/0321 345/697 |
| 11,315,483 | B2* | 4/2022 | Kiik | G09G 3/32 |
| 11,353,994 | B1* | 6/2022 | Yeke Yazdandoost | G06F 3/04182 |
| 2010/0283756 | A1* | 11/2010 | Ku | G06F 3/0425 345/174 |
| 2014/0198072 | A1* | 7/2014 | Schuele | G06F 3/043 345/174 |
| 2014/0354905 | A1* | 12/2014 | Kitchens | G06F 3/0421 349/12 |
| 2017/0123564 | A1* | 5/2017 | Cao | G06F 3/0412 |

(Continued)

FOREIGN PATENT DOCUMENTS

| | | |
|---|---|---|
| CN | 109754716 A | 5/2019 |
| KR | 10-2012-0110817 A1 | 10/2012 |

*Primary Examiner* — Allyson N Trail
(74) *Attorney, Agent, or Firm* — Innovation Counsel LLP

(57) ABSTRACT

A display device is disclosed that includes a plurality of pixels and a plurality of code pixels. The pixels include light-emitting elements, which display an image. The code pixels are disposed in the same layer as the pixels and are adjacent to a reference point disposed between the pixels. The code pixels include infrared light-emitting elements, which emit infrared light. At least one of the code pixels, disposed in a particular direction from the reference point, emit the infrared light to provide a code pattern having position information.

20 Claims, 18 Drawing Sheets

(56) References Cited

U.S. PATENT DOCUMENTS

| | | | | |
|---|---|---|---|---|
| 2018/0292002 | A1* | 10/2018 | Hélot | G05G 1/025 |
| 2020/0193120 | A1* | 6/2020 | Chen | H10K 59/60 |
| 2020/0395421 | A1* | 12/2020 | He | G06F 21/32 |
| 2021/0264128 | A1* | 8/2021 | Feng | G06F 3/0412 |
| 2021/0366990 | A1* | 11/2021 | Tang | H10K 65/00 |
| 2022/0232716 | A1* | 7/2022 | Lim | H10K 99/00 |
| 2022/0270522 | A1* | 8/2022 | Afsar | G09F 9/33 |
| 2023/0063966 | A1* | 3/2023 | Uchida | H01L 33/58 |

* cited by examiner

DU: SUB1, TFTL, EML, TFEL

DISPLAY DEVICE AND SENSING SYSTEM INCLUDING THE SAME

CROSS-REFERENCE TO RELATED APPLICATION

This application claims priority to Korean Patent Application No. 10-2021-0107344 filed on Aug. 13, 2021, and all the benefits accruing therefrom under 35 U.S.C. § 119, the disclosure of which is incorporated herein by reference in its entirety.

BACKGROUND

1. Field

The present disclosure relates to a display device and a sensing system including the same.

2. Description of the Related Art

As the information society has developed, the demand for display devices for displaying images has diversified. For example, display devices have been applied to various electronic devices such as smart phones, digital cameras, notebook computers, navigation systems, and smart televisions. Examples of display devices include flat panel display devices such as a liquid crystal display (LCD) device, a field emission display (FED) device, or an organic light-emitting diode (OLED) display device. The OLED display device, in particular, includes light-emitting elements, which can allow pixels of a display panel to emit light, and can thus display an image without the aid of a backlight unit that provides light to the display panel.

Recent display devices support input made with parts of the human body (e.g., a finger) and input made with an input pen. Display devices can detect input made with an electronic pen and can thus sense input more precisely than when being able to sense only input made with part of the human body.

SUMMARY

According to an embodiment of the disclosure, a display device comprises a plurality of pixels including light-emitting elements, the light-emitting elements operable to display an image, and a plurality of code pixels disposed in the same layer as the pixels, adjacent to a reference point disposed between the pixels, the code pixels including infrared light-emitting elements, the infrared light-emitting elements emit infrared light. In operation, at least one of the code pixels, disposed in a particular direction from the reference point, emits the infrared light to provide a code pattern having position information.

The reference point may correspond to an intersection between a first reference line extending in a first direction between the pixels, and a second reference line extending in a second direction intersecting the first direction between the pixels.

The code pixels may comprise a first code pixel disposed in the first direction from the reference point, a second code pixel disposed in the second direction from the reference point, a third code pixel disposed in a third direction opposite to the first direction from the reference point, and a fourth code pixel disposed in a fourth direction opposite to the second direction from the reference point. In operation, at least one of the first, second, third, and fourth code pixels may emit the infrared light to provide the position information corresponding to a predefined data code.

The pixels may include first, second, and third pixels sequentially arranged in the first direction. The reference point may correspond to an intersection between a first reference line extending in the first direction adjacent to the first, second, and third pixels, and a second reference line overlapping with the second pixel and extending in a second direction intersecting the first direction.

The code pixels may comprise a first code pixel disposed in the first direction from the reference point, a second code pixel disposed in the second direction from the reference point, a third code pixel disposed in a third direction opposite to the first direction from the reference point, and a fourth code pixel disposed in a fourth direction opposite to the second direction from the reference point. In operation, at least one of the first, second, third, and fourth code pixels may emit the infrared light to provide the position information corresponding to a predefined data code.

The first code pixel may overlap with the third pixel in the second direction. The second and fourth code pixels may overlap with the second pixel in the second direction. The third code pixel may overlap with the first pixel in the second direction.

The pixels may include first, second, and third pixels sequentially arranged in the first direction. The reference point may correspond to an intersection between a first reference line extending in the first direction between the pixels, and a second reference line overlapping with the first pixel and extending in a second direction intersecting the first direction.

The code pixels may comprise: a first code pixel disposed in a fifth direction between the first and second directions from the reference point, a second code pixel disposed in a sixth direction between the second direction and a third direction opposite the first direction from the reference point, a third code pixel disposed in a seventh direction opposite to the third direction from the reference point, and a fourth code pixel disposed in an eighth direction opposite to the sixth direction from the reference point. In operation, at least one of the first, second, third, and fourth code pixels may emit infrared light to provide the position information corresponding to a predefined data code.

The first and fourth code pixels may overlap with the second pixel in the second direction. The second and third code pixels may overlap with none of the first, second, and third pixels in the second direction.

The code pixels may comprise a first code pixel disposed in the first direction from the reference point, a second code pixel disposed in the second direction from the reference point, a third code pixel disposed in a third direction opposite to the first direction from the reference point, a fourth code pixel disposed in a fourth direction opposite to the second direction from the reference point, a fifth code pixel disposed from a fifth direction between the first and second directions from the reference point, a sixth code pixel disposed in a sixth direction between the second direction and the third direction from the reference point, a seventh code pixel disposed in a seventh direction opposite to the fifth direction from the reference point, and an eighth code pixel disposed in an eighth direction opposite to the sixth direction from the reference point. In operation, some of the first, second, third, fourth, fifth, sixth, seventh, and eighth code pixels may emit the infrared light to provide the position information corresponding to a predefined data code.

The first, fifth, and eighth code pixels may overlap with the second pixel in the second direction. The second and fourth code pixels may overlap with the first pixel in the second direction. The third, sixth, and seventh code pixels may overlap with none of the first, second, and third pixels in the second direction.

According to an embodiment of the disclosure, a display device comprises a first substrate, a thin-film transistor layer disposed on the first substrate and including thin-film transistors and switching transistors, a plurality of light-emitting elements disposed on the thin-film transistor layer, connected to the thin-film transistors, and displaying an image, and a plurality of infrared light-emitting elements disposed in the same layer as the light-emitting elements, connected to the switching transistors, and emitting infrared light. The infrared light-emitting elements are adjacent to a reference point, the reference point is disposed between the light-emitting elements. At least one of the infrared light-emitting elements, disposed in a particular direction from the reference point, forms a code pattern having position information by emitting infrared light.

The infrared light-emitting elements may include at least one of a metal complex compound, a donor-acceptor-donor compound, and a lanthanide compound, and the infrared light-emitting elements may have an emission spectrum of 800 nm or greater.

The thin-film transistors may comprise a first transistor controlling a driving current flowing in the light-emitting elements, a second transistor supplying a data voltage a first node, the first node is a source electrode of the first transistor, a third transistor connecting second and third nodes, the second node is a drain electrode of the first transistor and the third node is a gate electrode of the first transistor, a fourth transistor supplying an initialization voltage to the third node, a fifth transistor connected between a driving voltage line and the first transistor, a sixth transistor connected between the first transistor and the light-emitting elements, and a seventh transistor supplying the initialization voltage to anodes of the light-emitting elements.

The switching transistors may be turned on by gate signals to supply driving voltages to the infrared light-emitting elements.

The display device may further comprise a second substrate disposed on the light-emitting elements and the infrared light-emitting elements, and a plurality of touch electrodes disposed on the second substrate to sense touch input.

The display device may further comprise color filters disposed on the touch electrodes and overlapping with the light-emitting elements, and light-transmitting units disposed in the same layer as the color filters and overlapping with the infrared light-emitting elements.

The display device may further comprise an encapsulation layer disposed on the light-emitting elements and the infrared light-emitting elements, and a plurality of touch electrodes disposed on the encapsulation layer to sense touch input, the touch electrodes surround the light-emitting elements and the infrared light-emitting elements in a plan view.

According to an embodiment of the disclosure, a sensing system comprises a display device operable to display an image, and an input device operable to make an input by approaching or touching the display device. The display device comprises a plurality of pixels including light-emitting elements operable to display the image, and a plurality of code pixels disposed in the same layer as the pixels, adjacent to a reference point disposed between the pixels, and including infrared light-emitting elements operable to emit infrared light. In operation, at least one of the code pixels, disposed in a particular direction from the reference point, emits the infrared light to provide a code pattern having position information. The input device photographs an image of the code pixels, converts the code pixels into predetermined data codes, and transmits coordinate data comprised of the predetermined data codes to the display device.

The input device comprises a camera operable to photograph an image of the code pixels, a processor operable to convert the code pixels into the predetermined data codes by analyzing the photographed image of the code pixels and generating coordinate data comprised of the predetermined data codes, and a communication module operable to transmit the coordinate data to the display device.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Embodiments of the present disclosure provide a display device, which is capable of performing a function corresponding to exact input coordinates, reducing cost and power consumption, and simplifying a driving process thereof by generating input coordinate data of an input device, without a requirement of any complicated computation/correction process, in a case where input is entered with the input device, and a sensing system including the display device.

According to the aforementioned and other embodiments of the present disclosure, as code pixels emitting light of a particular wavelength range are disposed in a same layer as pixels displaying an image, input from an input device such as an input pen can be received. At least one code pixel or a combination of code pixels may have position information in accordance with a predetermined set of criteria and may thus correspond one-to-one to a predefined data code DC. Thus, as the display device and a sensing system including the display device can generate coordinate data consisting of data codes, without a requirement of any complicated computation/correction process, the display device and the sensing system can perform a function corresponding to the exact input coordinates, can reduce cost and power consumption, and can simplify their driving processes. Also, as the display device and the sensing system include code pixels disposed in the same layer as pixels, the display device and the sensing system can be applied to nearly all types of electronic devices without any size limitations.

Figure 1:
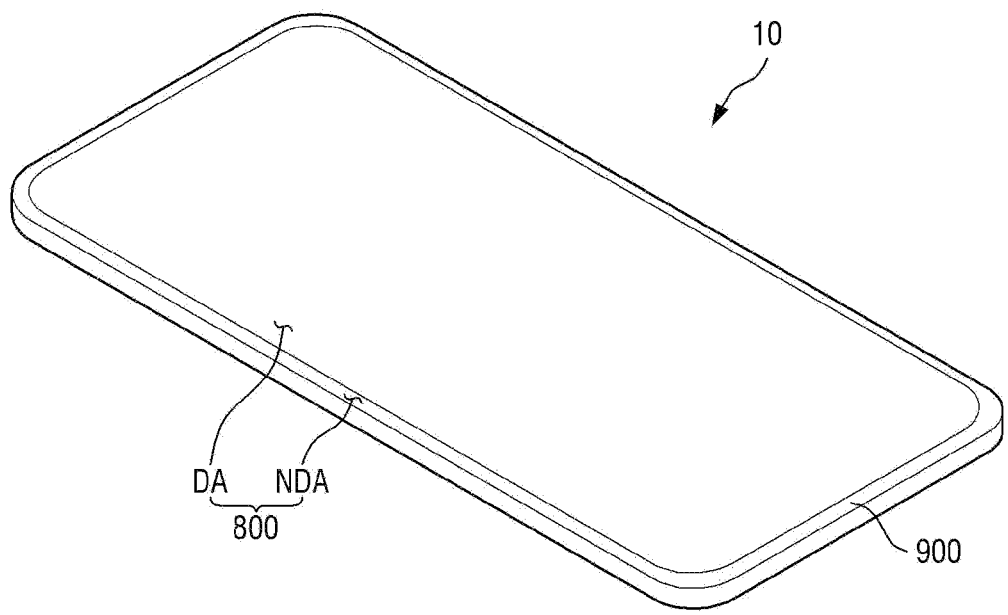
FIG. 1 is a perspective view of a display device according to an embodiment of the present disclosure.
Figure 1:
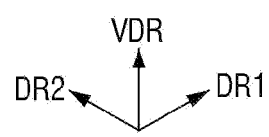

FIG. 1 is a perspective view of a display device according to an embodiment of the present disclosure.

Referring to FIG. 1, a display device 10 may be applicable to a portable electronic device such as a mobile phone, a smartphone, a tablet personal computer (PC), a mobile communication terminal, an electronic notepad, an electronic book (e-book), a portable multimedia player (PMP), a navigation device, or an ultra-mobile PC (UMPC). For example, the display device 10 may be used as the display unit of a television (TV), a laptop computer, a monitor, a billboard, or an Internet-of-Things (IoT) device. In another example, the display device 10 may be applicable to a wearable device such as a smartwatch, a watchphone, a glasses display, or a head-mounted display (HMD).

The display device 10 may have an almost rectangular shape in a plan view. For example, the display device 10 may have an almost rectangular shape with short sides in an first direction DR1 and long sides in a second direction DR2 in a plan view. The corners at which the short sides and the long sides of the display device 10 meet may be rounded or right-angled. The planar shape of the display device 10 is not limited to a rectangular shape, and the display device 10 may be formed in various other shapes, such as another polygonal shape, a circular shape, or an elliptical shape.

The display device 10 may include a cover window 800 and a lower cover 900.

The cover window 900 may be disposed on a display panel to cover the top surface of the display panel. The cover window 800 may protect the top surface of the display panel.

The cover window 800 may include a display area DA, in which an image from the display panel is displayed, and a non-display area NDA, which is disposed around the display area DA. The display area DA may emit light from a plurality of emission or aperture areas of the display panel.

The non-display area NDA may be formed to be opaque and may thus prevent elements or features other than an image from the display panel to become visible to a user. For example, the cover window 800 may be formed of glass, sapphire, or plastic, but the present disclosure is not limited thereto. The cover window 800 may be formed to be rigid or flexible.

The lower cover 900 may be disposed below the display panel. The lower cover 900 may form the bottom exterior of the display device 10. The lower cover 900 may be formed as a bowl and may thus accommodate the display panel. The sidewalls of the lower cover 900 may be in contact with the sides of the cover window 800 via an adhesive. In this case, the sidewalls of the lower cover 900 may be attached to the sides of the cover window 800 via an adhesive. The lower cover 900 may include plastic or a metal. The lower cover 900 may include stainless steel (SUS) or aluminum (Al) to enhance a heat dissipation effect.

Figure 2:
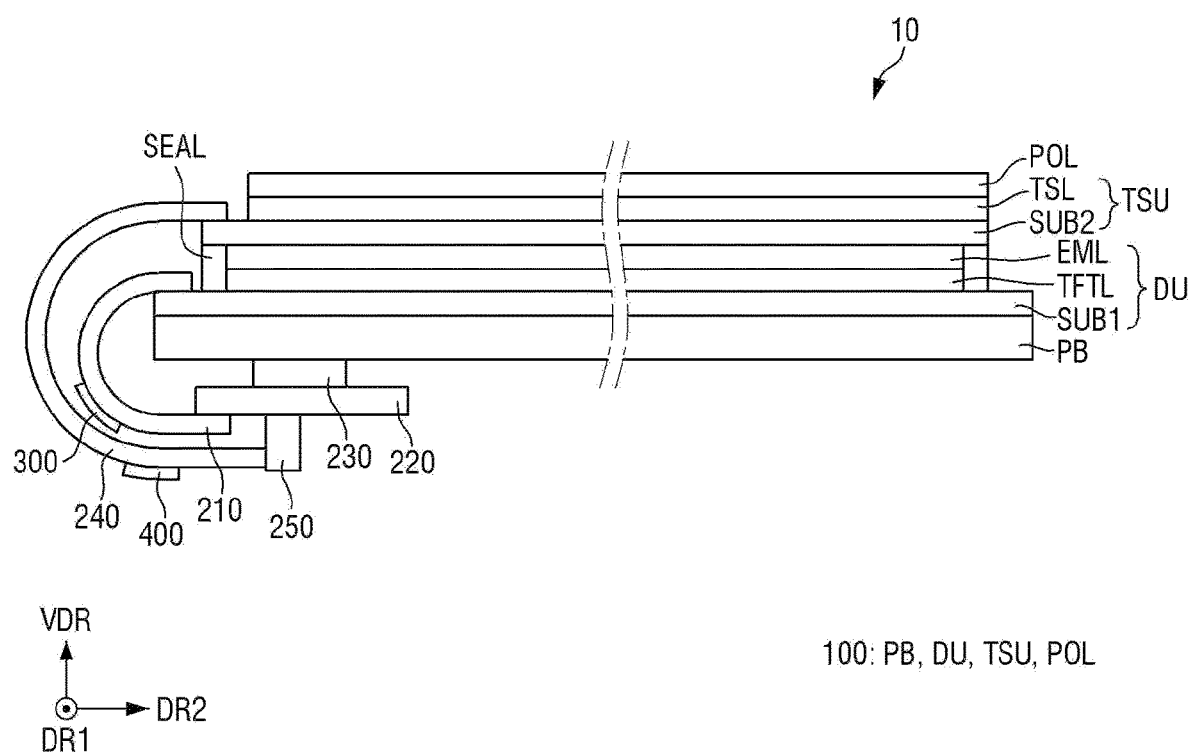
FIG. 2 is a cross-sectional view of the display device of FIG. 1.

FIG. 2 is a cross-sectional view of the display device of FIG. 1.

Referring to FIG. 2, the display device 10 may include a display panel 100, a first flexible film 210, a circuit board 220, an adhesive member 230, a second flexible film 240, a connector 250, a display driver 300, and a touch driver 400.

The display panel 100 may include a display unit DU, a touch sensing unit TSU, a polarizing film POL, and a panel bottom cover PB. The display unit DU may include a first substrate SUB1, a thin-film transistor (TFT) layer TFTL, and a light-emitting element layer EML.

The first substrate SUB1 may be a base substrate or a base member. For example, the first substrate SUB1 may be a rigid substrate. The first substrate SUB1 may include a glass material or a metallic material, but the present disclosure is not limited thereto. In another example, the first substrate SUB1 may be a flexible substrate that is bendable, foldable, or rollable. The first substrate SUB1 may include an insulating material such as a polymer resin (e.g., polyimide (PI)).

The TFT layer TFTL may be disposed on the first substrate SUB1. The TFT layer TFTL may include a plurality of TFTs that form the pixel circuitry of pixels. The TFT layer TFTL may further include gate lines, data lines, power supply lines, gate control lines, fan-out lines, which connect the display driver 300 and the data lines, and lead lines, which connect the display driver 300 and a pad unit. Each of the TFTs may include a semiconductor region, a source electrode, a drain electrode, and a gate electrode. For example, in a case where a gate driver is formed on one side of the non-display area NDA of the display panel 100, the gate driver may include the TFTs.

The TFT layer TFTL may be disposed in the display area DA and the non-display area NDA. The TFTs, the gate lines, the data lines, and the power supply lines of the TFT layer TFTL may be disposed in the display area DA. The gate control lines, the fan-out lines, and the lead lines of the TFT layer TFTL may be disposed in the non-display area NDA.

The light-emitting element layer EML may be disposed on the TFT layer TFTL. The light-emitting element layer EML may include a plurality of light-emitting elements, which emit light and have a structure in which first electrodes, emission layers, and second electrodes are sequentially stacked, and a pixel-defining film, which defines the pixels. The light-emitting elements of the light-emitting element layer EML may be disposed in the display area DA.

For example, the emission layers may be organic emission layers including an organic material. The emission layers may include hole transport layers, organic emission layers, and electron transport layers. As the first electrodes receive a predetermined voltage through the TFTs of the TFT layer TFTL and the second electrodes receive a common voltage, holes and electrons may move to the organic emission layers through the hole transport layers and the electron transport layers, respectively, and may combine together in the organic emission layers to emit light. For example, the first electrodes may be, but are not limited to, anodes, and the second electrodes may be, but are not limited to, cathodes.

Alternatively, the light-emitting elements may be quantum-dot light-emitting diodes (LEDs) including quantum-dot emission layers, inorganic LEDs including an inorganic semiconductor, or microscopic LEDs (microLEDs).

A sealing member SEAL may be disposed along the edges of each of the first substrate SUB1 and a second substrate SUB2 to bond the first and second substrates SUB1 and SUB2. The sealing member SEAM may surround the TFT layer TFTL and the light-emitting element layer EML. The sealing member SEAL may be a frit adhesive layer, an ultraviolet (UV)-curable resin, or a thermosetting resin, but the present disclosure is not limited thereto.

The touch sensing unit TSU may include the second substrate SUB2 and a touch sensor layer TSL. For example, the touch sensing unit TSU may be fabricated as a separate element and may then be attached onto the display unit DU.

The second substrate SUB2 may be disposed on the light-emitting element layer EML. The second substrate SUB2 may be a base substrate or a base member and may support the touch sensor layer TSL. The second substrate SUB2 may be a base member encapsulating the display unit DU. For example, the second substrate SUB2 may be a rigid substrate. The second substrate SUB2 may include a glass material or a metallic material, but the present disclosure is not limited thereto. In another example, the second substrate SUB2 may include an insulating material such as a polymer resin (e.g., PI).

The touch sensor layer TSL may be disposed on the second substrate SUB2. The touch sensor layer TSL may include a plurality of touch electrodes for sensing touch input from the user in a capacitive manner and touch lines for connecting the touch electrodes and the touch driver 400. For example, the touch sensor layer TSL may sense touch input from the user in a mutual capacitance manner or a self-capacitance manner.

The polarizing film POL may be disposed on the touch sensing unit TSU. The polarizing film POL may be attached on the touch sensing unit TSU via an optically clear adhesive (OCA) film or an optically clear resin (OCR). For example, the polarizing film POL may include a linear polarizing plate and a phase retardation film such as a quarter-wave (14) plate, and the linear polarizing plate and the phase retardation film may be sequentially stacked on the touch sensing unit TSU.

The panel bottom cover PB may be disposed at the bottom of the display panel 100. The panel bottom cover PB may be attached to the bottom surface of the display panel 100 via an adhesive. Here, the adhesive may be a pressure sensitive adhesive (PSA). The panel bottom cover PB may include at least one of a light-blocking member for absorbing light incident from the outside, a buffer member for absorbing shock from the outside, and a heat dissipation member for effectively releasing heat from the display panel 100.

The first flexible film 210 may be attached on display pads of the display unit DU via an anisotropic conductive film (ACF). The first flexible film 210 may mount the display driver 300. Lead lines of the first flexible film 210 may be electrically connected to the display pads of the display unit DU. The first flexible film 210 may be a flexible printed circuit board (FPCB), a printed circuit board (PCB), or a chip-on-film (COF).

The circuit board 220 may support the connector 250 and may provide signals and power to the display driver 300 and the touch driver 400. For example, the circuit board 220 may provide signals from a timing controller (not illustrated) and power from a power supply unit (not illustrated) to the display driver 300 and the touch driver 400. The circuit board 220 may provide signals for synchronizing the display driver 300 and the touch driver 400. Thus, signal lines and power lines may be provided on the circuit board 220.

The adhesive member 230 may attach the circuit board 220 on the bottom surface of the panel bottom cover PB. Thus, the circuit board 220 may be supported by the panel bottom cover PB. The adhesive member 230 may be a PSA.

The second flexible film 240 may be attached on touch pads of the touch sensing unit TSU via an ACF. The second flexible film 240 may mount the touch driver 400. Lead lines of the second flexible film 240 may be electrically connected to the touch pads of the touch sensing unit DU. The second flexible film 240 may be an FPCB, a PCB, or a COF.

The connector 250 may connect the circuit board 220 and the second flexible film 240. The touch driver 400 may be electrically connected to the circuit board 220 through the second flexible film 240 and the connector 250. Thus, the touch driver 400 may receive signals from the circuit board 220 and may thus be synchronized with the display driver 300.

The display driver 300 may output signals and voltages for driving the display unit DU. The display driver 300 may provide data voltages to the data lines. The data voltages may be provided to the pixels and may determine the luminances of the pixels. The display driver 300 may provide power supply voltages to the power supply lines and may provide gate control signals to the gate driver. The display driver 300 may be formed as an integrated circuit (IC) and may be mounted on the first flexible film 210 in a COF manner or a tape carrier package (TCP) manner. Alternatively, the display driver 300 may be mounted on the circuit board 220.

The touch driver 400 may output signals and voltages for driving the touch sensing unit TSU. The touch driver 400 may be formed as an IC and may be mounted on the second flexible film 240 in a COF manner or a tape carrier package (TCP) manner. The touch driver 400 may provide driving signals to the touch electrodes and may sense capacitance variations between the touch electrodes. For example, the driving signals may be pulse signals having a predetermined frequency. The touch driver 400 may calculate the presence and the coordinates of touch input based on capacitance variations between the touch electrodes.

Figure 3:
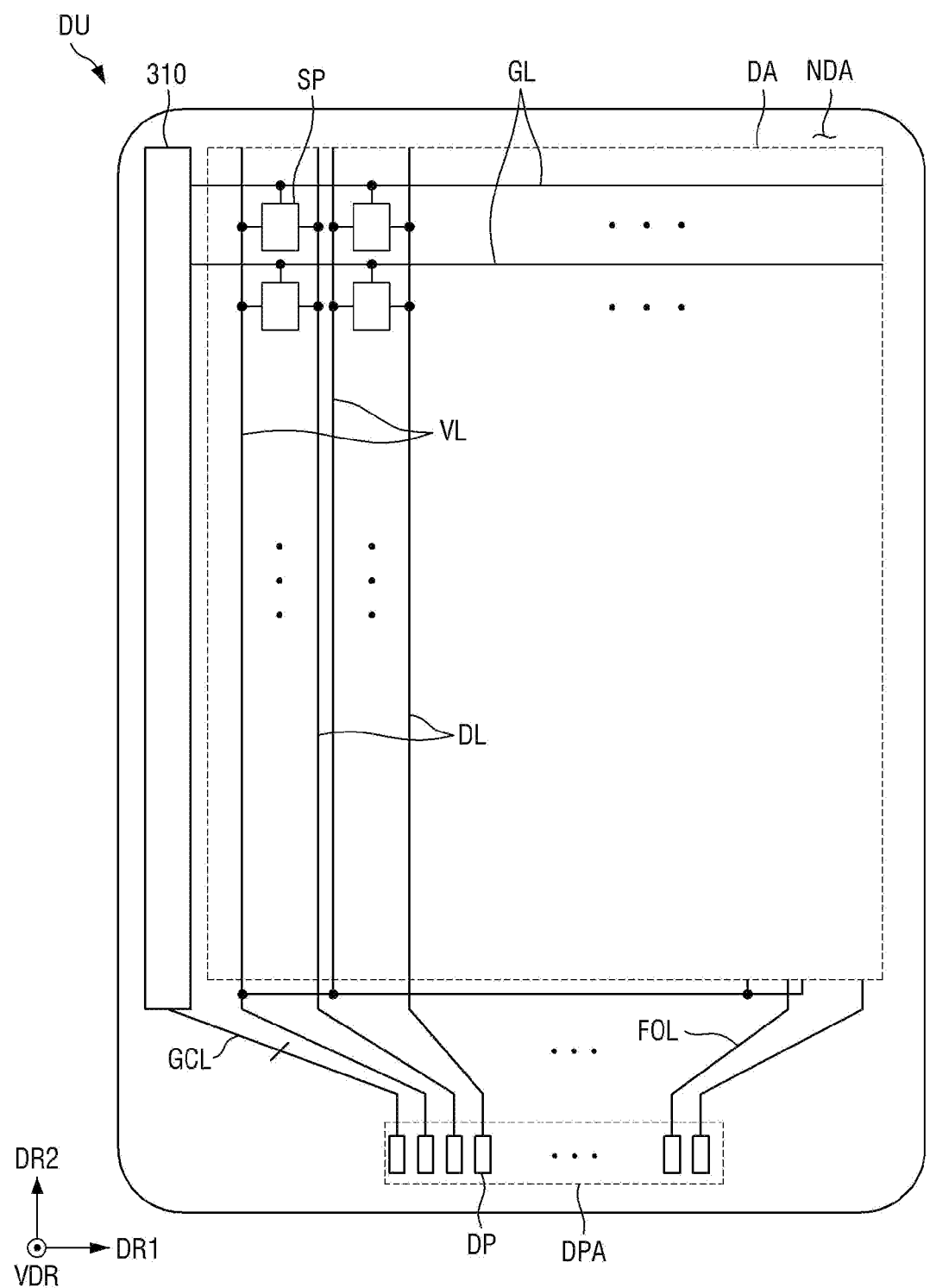
FIG. 3 is a plan view of a display unit of the display device of FIG. 1.

FIG. 3 is a plan view of the display unit of the display device of FIG. 1.

Referring to FIG. 3, the display unit DU may include a display area DA and a non-display area NDA.

The display area DA, which is an area that displays an image, may be defined as a central part of the display panel 100. The display area DA may include a plurality of pixels SP, a plurality of gate lines GL, a plurality of data lines DL, and a plurality of power supply lines VL. The pixels SP may be defined as minimal units for outputting light.

The gate lines GL may provide gate signals from a gate driver 310 to the pixels SP. The gate lines GL may extend in the first direction DR1 and may be spaced apart from one another in the second direction DR2, which intersects the first direction DR1.

The data lines DL may provide data voltages from a display driver 300 to the pixels SP. The data lines DL may extend in the second direction DR2 and may be spaced apart from one another in the first direction DR1.

The power supply lines VL may provide power supply voltages from the display driver 300 to the pixels SP. The power supply lines VL may include at least one of a driving voltage line, an initialization voltage line, a reference voltage line, a common voltage line, and a low-potential line. The power supply lines VL may extend in the second direction DR2 and may be spaced apart from one another in the first direction DR1.

The non-display area NDA may surround the display area DA. The non-display area NDA may include the gate driver 310, fan-out lines FOL, gate control lines GCL, and a display pad area DPA. The gate driver 310 may generate a plurality of gate signals based on gate control signals and may sequentially provide the gate signals to the gate lines GL in a predefined order.

The fan-out lines FOL may extend from display pads DP to the display area DA. The fan-out lines FOL may provide data voltages from the display driver 300 to the data lines DL.

The gate control lines GCL may extend from the display pads DP to the gate driver 310. The gate control lines GCL may provide the gate control signals from the display driver 300 to the gate driver 310.

The display pad area DPA may be disposed on an edge of the non-display area NDA. The display pad area DPA may be electrically connected to the first flexible film 210 via a low-resistance, high-reliability material such as an ACF or a self-assembly anisotropic conductive paste (SAP). The display pad area DPA may include a plurality of display pad portions DP. The display pads DP may be connected to a graphics system through the first flexible film 210 and the circuit board 220. The display pads DP may receive data voltages from the display driver 300.

Figure 4:
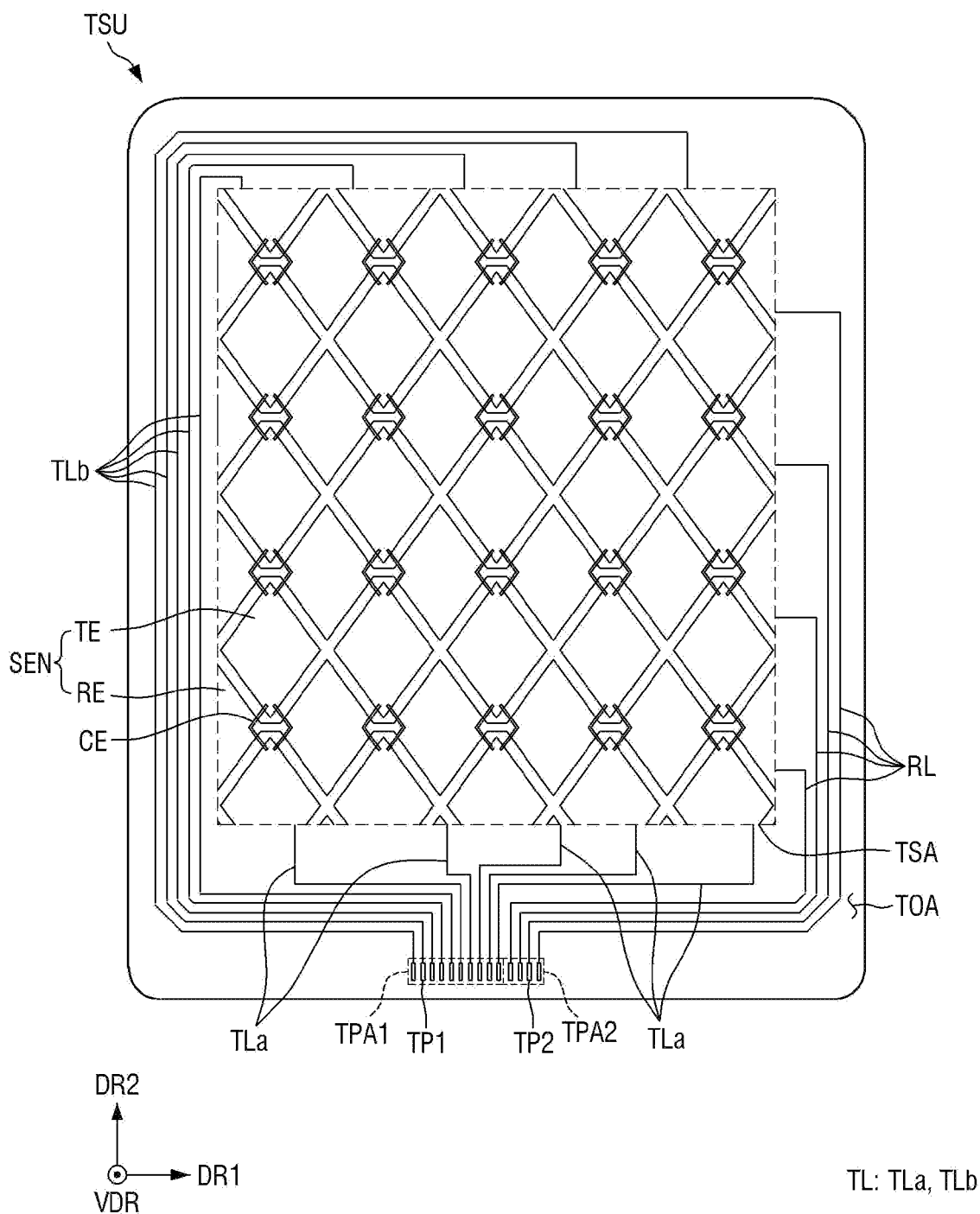
FIG. 4 is a plan view of a touch sensing unit of the display device of FIG. 1.

FIG. 4 is a plan view of the touch sensing unit of the display device of FIG. 1.

Referring to FIG. 4, the touch sensing unit TSU may include a touch sensor area TSA, which detects touch input from the user, and a touch peripheral area TOA, which is disposed around the touch sensor area TSA. The touch sensor area TSA may overlap with the display area DA of the display unit DU, and the touch peripheral area TOA may overlap with the non-display area NDA of the display unit DU.

The touch sensor area TSA may include a plurality of touch electrodes SEN. The touch electrodes SEN may form mutual capacitances or self-capacitances to sense touch input from an object or a person. The touch electrodes SEN may be connected to the touch driver 400 through the touch lines. The touch electrodes SEN may include a plurality of driving electrodes TE and a plurality of sensing electrodes RE. The touch lines may include driving lines TL, which are connected to the driving electrodes TE, and sensing lines RL, which are connected to the sensing electrodes RE.

The driving electrodes TE may be arranged in the first and second directions DR1 and DR2. The driving electrodes TE may be spaced apart from one another in the first and second directions DR1 and DR2. Each pair of adjacent driving electrodes TE in the second direction DR2 may be electrically connected via bridge electrodes CE.

The driving electrodes TE may be connected to first touch pads TP1 via driving lines TL. The driving lines TL may include lower driving lines TLa and upper driving lines TLb. For example, driving electrodes TE in the lower part of the touch sensor area TSA may be connected to the first touch pads TP1 via the lower driving lines TLa, and driving electrodes TE in the upper part of the touch sensor area TSA may be connected to the first touch pads TP1 via the upper driving lines TLa. The lower driving lines TLa may extend to the first touch pads TP1 through the lower part of the touch peripheral area TOA. The upper driving lines TLa may extend to the first touch pads TP1 through the upper, left, and lower parts of the touch peripheral area TOA. The first touch pads TP1 may be connected to the touch driver 400 via the second flexible film 240.

The bridge electrodes CE may be bent at least once. For example, the bridge electrodes CE may be in the shape of angle brackets (i.e., "<" and ">"), but the shape of the bridge electrodes CE is not particularly limited. Each pair of adjacent driving electrodes TE in the second direction DR2 may be connected by multiple bridge electrodes CE, and thus, even if one of the bridge electrodes CE is disconnected, the driving electrodes TE can be stably connected via the other non-disconnected bridge electrodes CE. Each pair of adjacent driving electrodes TE may be connected by two bridge electrodes CE, but the plurality of bridge electrodes CE is not particularly limited.

The bridge electrodes CE may be disposed in a different layer from the driving electrodes TE and the sensing electrodes RE. Each pair of adjacent sensing electrodes RE in the first direction DR1 may be electrically connected via connectors disposed in the same layer as the driving electrodes TE or the sensing electrodes RE, and each pair of adjacent driving electrodes TE in the second direction DR2 may be electrically connected via bridge electrodes CE disposed in a different layer from the driving electrodes TE or the sensing electrodes RE. Thus, even if the bridge electrodes CE overlap with the sensing electrodes RE in a thickness direction VDR, the driving electrodes TE can be insulated from the sensing electrodes RE. Mutual capacitances may be formed between the driving electrodes TE and the sensing electrodes RE.

The sensing electrodes RE may extend in the first direction DR1 and may be spaced apart from one another in the second direction DR2. The sensing electrodes RE may be arranged in the first and second directions DR1 and DR2, and each pair of adjacent sensing electrodes RE in the first direction DR1 may be electrically connected by a connector.

The sensing electrodes RE may be connected to second touch pads TP2 through sensing lines RL. For example, sensing electrodes RE disposed on the right side of the touch sensor area TSA may be connected to the second touch pads TP2 through the sensing lines RL. The sensing lines RL may extend to the second touch pads TP2 through the right and lower parts of the touch peripheral area TOA. The second touch pads TP2 may be connected to the touch driver 400 through the second flexible film 240.

First and second touch pad areas TPA1 and TPA2 may be disposed on an edge of the touch peripheral area TOA. The first and second touch pad areas TPA1 and TPA2 may be electrically connected to the second flexible film 240 via a low-resistance, high-reliability material such as an ACF or a SAP.

The first touch pad area TPA1 may include a plurality of the first touch pads TP1. The second touch pad area TPA2 may include a plurality of the second touch pads TP2. The first touch pads TP1 and the second touch pads TP2 may be electrically connected to the touch driver 400, which is disposed on the second flexible film 240. The first touch pads TP1 may provide touch driving signals to the driving electrodes TE through the driving lines TL. The second touch pads TP2 may provide sensing signals from the sensing lines RL to the touch driver 400, and the touch driver 400 may sense mutual capacitance variations between the driving electrodes TE and the sensing electrodes RE.

Alternatively, the touch driver 400 may provide driving signals to both the driving electrodes TE and the sensing electrodes RE and may receive sensing signals from both the driving electrodes TE and the sensing electrodes RE. The touch driver 400 may sense charge variations in the driving electrodes TE and the sensing electrodes RE based on sensing signals.

Figure 5:
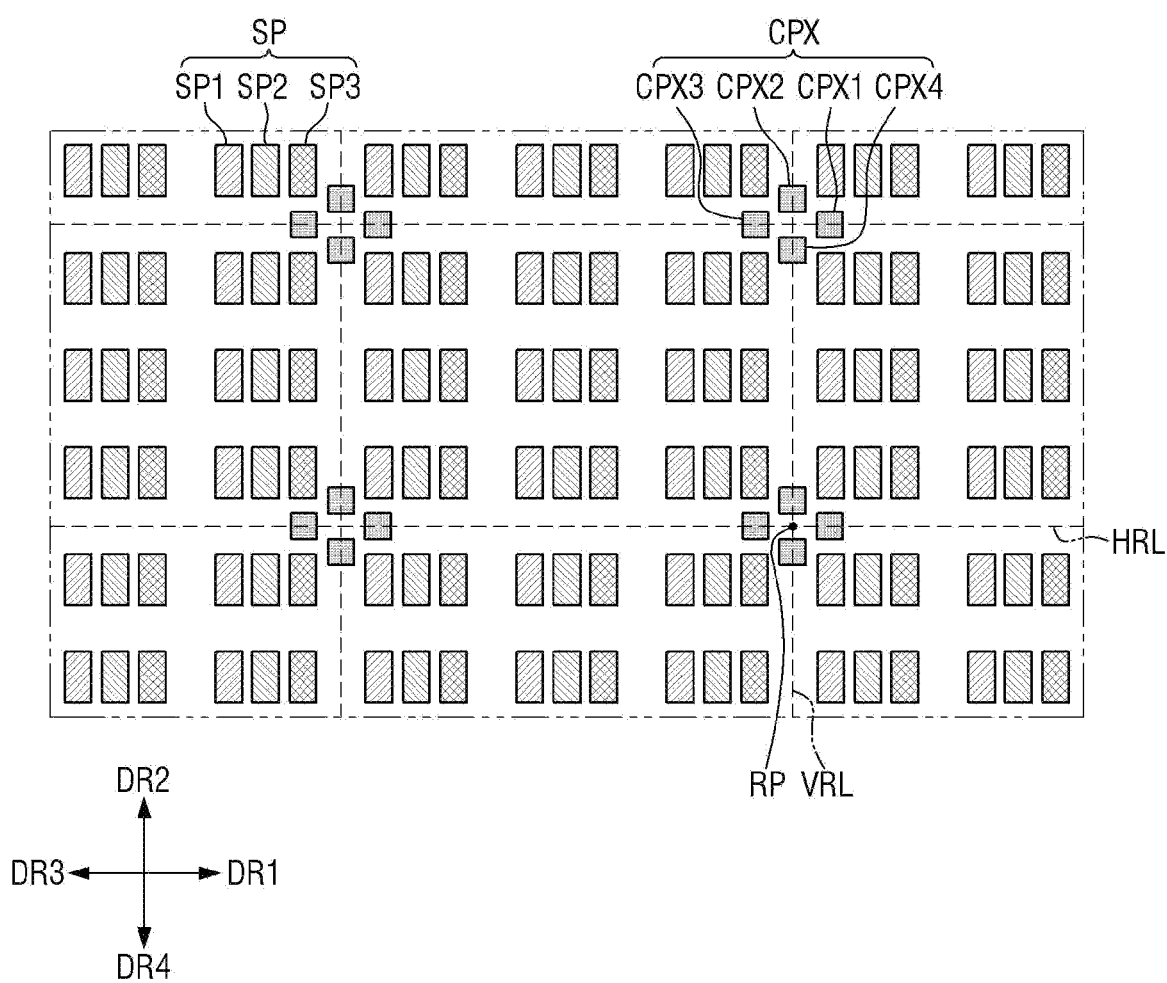
FIG. 5 is a layout view of a display area of the display device of FIG. 1.

FIG. 5 is a layout view of a display area of the display device of FIG. 1.

Referring to FIG. 5, the display area DA may include a plurality of pixels SP and a plurality of code pixels CPX.

The pixels SP may emit light so that the display device 10 may display an image. The pixels SP may include first pixels SP1, second pixels SP2, and third pixels SP3. The first pixels SP1, the second pixels SP2, and the third pixels SP3 may emit light through their respective emission areas. The first pixel SP1 may emit light of a first color or red light, the second pixels SP2 may emit light of a second color or green light, and the third pixels SP3 may emit light of a third color or blue light. The sizes of the emission areas of the first pixels SP1, the second pixels SP2, and the third pixels SP3 may be substantially the same, but the present disclosure is not limited thereto. A unit pixel may include at least one first pixel SP1, at least one second pixel SP2, and at least one third pixel SP3 and may display white gradation.

In one unit pixel, first, second, and third pixels SP1, SP2, and SP3 may be sequentially arranged in a first direction DR1. A third pixel SP3 of one unit pixel may be adjacent to a first pixel SP1 of a neighboring unit pixel in the first direction DR1. A plurality of first pixels SP1 may be arranged in the same column, a plurality of second pixels SP2 may be arranged in the same column adjacent to the column of the plurality of first pixels SP1 in the first direction DR1, and a plurality of third pixels SP3 may be arranged in the same column adjacent to the column of the plurality of second pixels SP2 in the first direction DR1.

Code pixels CPX may be disposed in the same layer as the pixels SP, which display an image. The code pixels CPX may emit light of a particular wavelength range and may thus form a code pattern having position information. The code pixels CPX may emit infrared (IR) light, but the present disclosure is not limited thereto. The code pixels CPX may be arranged over the entire display area DA. The plurality of code pixels CPX per unit area may be smaller than the plurality of pixels SP per unit area. The plurality of code pixels CPX per unit area may be determined by the resolution of pixels SP. A plurality of code pixels CPX may be disposed adjacent, in particular directions, to each reference point RP between multiple pixels SP.

Reference points RP may be the intersections between first reference lines HRL and second reference lines VRL. The first reference lines HRL and the second reference lines VRL may be invisible imaginary lines. The first reference lines HRL may extend in the first direction DR1. Each of the first reference lines HRL may intersect the second reference lines VRL, thereby forming a plurality of reference points RP. The first reference lines HRL may be arranged at intervals of a plurality of rows of pixels SP. The second reference lines VRL may extend in a second direction DR2. Each of the second reference lines VRL may intersect the first reference lines HRL, thereby forming the plurality of reference points RP. The second reference lines VRL may be arranged at intervals of a plurality of columns of pixels SP.

Thus, a plurality of code pixels CPX that are adjacent to one another in the first or second direction DR1 or DR2 may be arranged at intervals of a plurality of unit pixels, each including first, second, and third pixels SP1, SP2, and SP3. For example, two adjacent code pixels CPX in the first direction DR1 may be arranged at intervals of three unit pixels, and two adjacent code pixels CPX in the second direction DR2 may also be arranged at intervals of three unit pixels. However, the present disclosure is not limited to this example.

The code pixels CPX may include code pixel arrays, which are arrays of first, second, third, and fourth code pixels CPX1, CPX2, CPX3, and CPX4. Each of the code pixel arrays may surround one of the reference points RP. Each of the code pixel arrays may be arranged adjacent, in particular directions, to one of the reference points RP. For example, in each of the code pixel arrays, first, second, third, and fourth code pixels CPX1, CPX2, CPX3, and CPX4 may be arranged adjacent to one reference point RP in the first direction DR1, the second direction DR2, a third direction DR3, and a third direction DR4, respectively. The first code pixel CPX1 of each of the code pixel arrays may overlap with a first pixel SP1 in the second direction DR2. The second and fourth code pixels CPX2 and CPX4 of each of the code pixel arrays may overlap with none of first, second, and third pixels SP1, SP2, and SP3 in the second direction DR2. The third code pixel CPX3 of each of the code pixel arrays may overlap with a third pixel SP3 in the second direction DR2.

An image of the code pixels CPX may be photographed by a camera near the front of the display device 10, and the code pixels CPX may be identified from the photographed image. At least one of the code pixels CPX included in each of the code pixel arrays may emit IR light and may correspond to a predefined data code. For example, at least one code pixel CPX or a combination of code pixels CPX may correspond to a data code designated for a particular position.

As the display device 10 includes the code pixels CPX, which are disposed in the same layer as the pixels SP displaying an image and emit light of a particular wavelength range, the display device 10 can receive input from an input device such as an input pen. At least one code pixel CPX or a combination of code pixels CPX may have position information in accordance with a predetermined set of criteria and may thus correspond one-to-one to a predefined data code. Thus, the display device 10 can receive coordinate data generated simply using data codes, without a requirement of any complicated computation/correction process, and can properly perform a function corresponding to the exact input coordinates, can reduce cost and power consumption, and can simplify its driving process. Also, as the display device 10 includes the code pixels CPX, which are disposed in the same layer as the pixels SP, the display device 10 can be applied to nearly all types of electronic devices without any size limitations.

Figure 6:
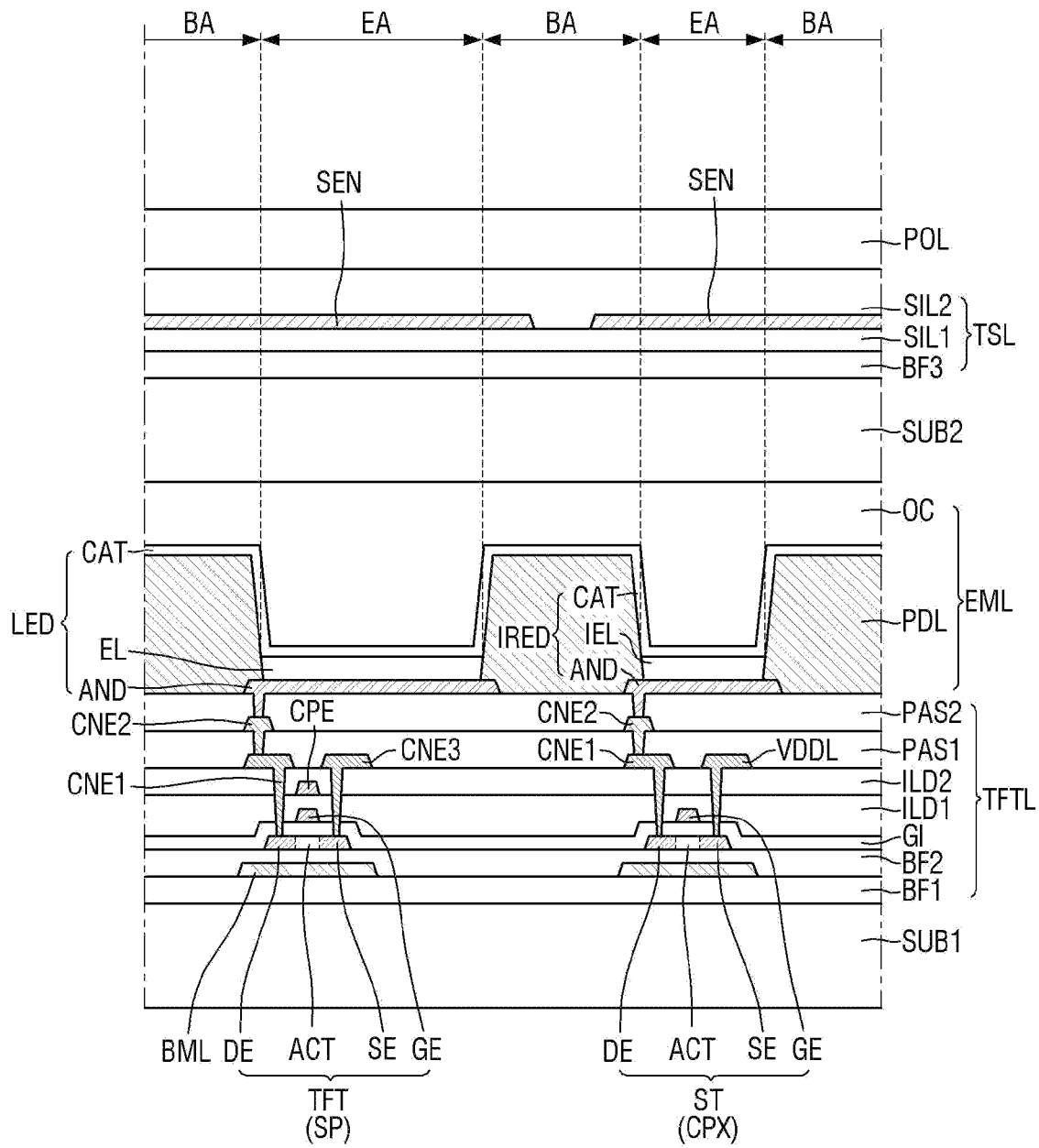
FIG. 6 is a cross-sectional view of the display area of the display device of FIG. 1.

FIG. 6 is a cross-sectional view of the display area of the display device of FIG. 1.

Referring to FIG. 6, the display panel 100 may include the display unit DU, the touch sensing unit TSU, and the polarizing film POL. The display unit DU may include the first substrate SUB1, the TFT layer TFTL, and the light-emitting element layer EML.

The first substrate SUB1 may be a base substrate or a base member. For example, the first substrate SUB1 may be a rigid substrate. The first substrate SUB1 may include a glass material or a metallic material, but the present disclosure is not limited thereto. In another example, the first substrate SUB1 may be a flexible substrate that is bendable, foldable, or rollable. The first substrate SUB1 may include an insulating material such as a polymer resin (e.g., PI).

The TFT layer TFTL may include a first buffer layer BF1, a light-blocking layer BML, a second buffer layer BF2, a TFT "TFT", a switching transistor ST, a gate insulating film GI, a first interlayer insulating film ILD1, a capacitor electrode CPE, a second interlayer insulating film ILD2, first connecting electrodes CNE1, second connecting electrodes CNE2, and third connecting electrodes CNE3, a first passivation layer PAS1, and a second passivation layer PAS2.

The first buffer layer BF1 may be disposed on the first substrate SUB1. The first buffer layer BF1 may include one or more inorganic films capable of preventing the penetration of the air or moisture. For example, the first buffer layer BF1 may include a plurality of inorganic films that are alternately stacked.

A light-blocking layer BML may be disposed on the first buffer layer BF1. For example, the light-blocking layer BML may be formed as a single layer or a multilayer including molybdenum (Mo), Al, chromium (Cr), gold (Au), titanium (Ti), nickel (Ni), neodymium (Nd), copper (Cu), or an alloy thereof. In another example, the light-blocking layer BML may be an organic film including a black pigment.

The second buffer layer BF2 may be disposed on the first buffer layer BF1 and the light-blocking layer BML. The second buffer layer BF2 may include one or more inorganic films capable of preventing the penetration of the air or moisture. For example, the second buffer layer BF2 may include a plurality of inorganic films that are alternately stacked.

The TFT "TFT" may be disposed on the second buffer layer BF2 and may configure the pixel circuitry of a pixel SP. As each pixel SP includes a plurality of TFTs, each pixel SP can emit light corresponding to the magnitude of a data voltage. The TFT "TFT" may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap with the light-blocking layer BML in a thickness direction. The semiconductor region ACT may overlap with the gate electrode GE in a thickness direction and may be insulated from the gate electrode GE by the gate insulating film GI. The source electrode SE and the drain electrode DE may be provided by turning the material of the semiconductor region ACT into a conductor.

The gate electrode GE may be disposed on the gate insulating film GI. The gate electrode GE may overlap with the semiconductor region ACT with the gate insulating film GI interposed therebetween.

The switching transistor ST may be formed of the same material as the TFT "TFT", in the same layer as the TFT "TFT". The switching transistor ST may form the pixel circuitry of a code pixel CPX. As the code pixel CPX includes the switching transistor ST, the code pixel CPX can control the timing of emission of IR light. The switching transistor ST may include a semiconductor region ACT, a source electrode SE, a drain electrode DE, and a gate electrode GE.

The gate insulating film GI may be provided on the semiconductor regions ACT, the source electrodes SE, and the drain electrodes DE. For example, the gate insulating film GI may cover the semiconductor regions ACT, the source electrodes SE, the drain electrodes DE, and the second buffer layer BF2 and may insulate the semiconductor regions ACT from the gate electrodes GE. The gate insulating film GI may include contact holes that are penetrated by a driving voltage line VDDL, the first connecting electrodes CNE1, and the third connecting electrodes CNE3.

The first interlayer insulating film ILD1 may be disposed the gate electrode GE and the gate insulating film GI. The first interlayer insulating film ILD1 may include contact holes that are penetrated by the driving voltage line VDDL, the first connecting electrodes CNE1, and the third connecting electrodes CNE3. The contact holes of the first interlayer insulating film ILD1 may be connected to the contact holes of the gate insulating film GI and contact holes of the second interlayer insulating film ILD2.

The capacitor electrode CPE may be disposed on the first interlayer insulating film ILD1. The capacitor electrode CPE may overlap with the gate electrode GE in the thickness direction. The capacitor electrode CPE and the gate electrode GE may form the capacitor of the pixel SP.

The second interlayer insulating layer ILD2 may be disposed on the capacitor electrode CPE and the first interlayer insulating film ILD1. The second interlayer insulating film ILD2 may include contact holes that are penetrated by the driving voltage line VDDL, the first connecting electrodes CNE1, and the third connecting electrodes CNE3. The contact holes of the second interlayer insulating film ILD2 may be connected to the contact holes of the first interlayer insulating film ILD1 and the contact holes of the gate insulating film GI.

The first connecting electrodes CNE1 may be disposed on the second interlayer insulating film ILD2. The first connecting electrodes CNE1 may connect the drain electrodes DE of the TFT "TFT" and the switching transistor ST and the second connecting electrodes CNE2. The first connecting electrodes CNE1 may be inserted in the contact holes of each of the second interlayer insulating film ILD2, the first interlayer insulating film ILD1, and the gate insulating film GI and may thus be in contact with the drain electrodes DE of the TFT "TFT" and the switching transistor ST.

The third connecting electrodes CNE3 may be formed of the same material as the first connecting electrodes CNE1, in the same layer as the first connecting electrodes CNE1. The third connecting electrodes CNE3 may connect other transistors (not illustrated) of the pixel SP or power supply lines (not illustrated) to the TFT "TFT". The third connecting electrodes CNE3 may be inserted in the contact holes of each of the second interlayer insulating film ILD2, the first interlayer insulating film ILD1, and the gate insulating film GI and may thus be in contact with the drain electrode DE of the TFT "TFT".

The driving voltage line VDDL may be formed of the same material as the first connecting electrodes CNE1 and the third connecting electrodes CNE3, in the same layer as the first connecting electrodes CNE1 and the third connecting electrodes CNE3. The driving voltage line VDDL may provide a driving voltage to the switching transistor ST. The driving voltage line VDDL may be inserted in the contact holes of each of the second interlayer insulating film ILD2, the first interlayer insulating film ILD1, and the gate insulating film GI and may thus be in contact with the drain electrode DE of the switching transistor ST.

The first passivation layer PAS1 may be disposed on the first connecting electrodes CNE1, the third connecting electrodes CNE3, the driving voltage line VDDL, and the second interlayer insulating film ILD2. The first passivation layer pAS1 may protect the TFT "TFT" and the switching transistor ST. The first passivation layer PAS1 may include contact holes that are penetrated by the second connecting electrodes CNE2.

The second connecting electrodes CNE2 may be disposed on the first passivation layer PAS1. The second connecting electrodes CNE2 may connect a pixel electrode AND of a light-emitting element LED and the first connecting electrodes CNE1. The second connecting electrodes CNE2 may also connect a pixel electrode AND of an IR light-emitting element IRED and the first connecting electrodes CNE1. The second connecting electrodes CNE2 may be inserted in the contact holes of the first passivation layer PAS1 and may thus be in contact with the first connecting electrodes CNE1.

The second passivation layer PAS2 may cover the second connecting electrodes CNE2 and the first passivation layer PAS1. The second passivation layer PAS2 may include contact holes that are penetrated by the pixel electrodes AND.

The light-emitting element layer EML may be disposed on the TFT layer TFTL. The light-emitting element layer EML may include the light-emitting element LED, the IR light-emitting element IRED, the pixel-defining film PDL, and a planarization layer OC.

The light-emitting element LED may emit visible light and may thus display an image. The light-emitting element LED may include a pixel electrode AND, an emission layer EL, and a common electrode CAT. The pixel electrode AND of the light-emitting element LED may be disposed on the second passivation layer PAS2. The pixel electrode AND of the light-emitting element LED may be disposed to overlap with an emission area EA of the pixel SP, defined by the pixel-defining film PDL. The pixel electrode AND of the light-emitting element LED may be connected to the drain electrode DE of the TFT "TFT" through the first connecting electrodes CNE1 and the second connecting electrodes CNE2.

The pixel electrode AND of the light-emitting element LED may reflect light of a particular wavelength range. The pixel electrode AND of the light-emitting element LED may reflect IR light or UV light. The pixel electrode AND of the light-emitting element LED may include a material capable of reflecting IR light or UV light. For example, the pixel electrode AND of the light-emitting element LED may include at least one of silver (Ag), Cu, Al, Ni, and lanthanum (La). In another example, the pixel electrode AND of the light-emitting element LED may include a material such as indium tin oxide (ITO), indium zinc oxide (IZO), or indium tin zinc oxide (ITZO). In yet another example, the pixel electrode AND of the light-emitting element LED may include a layer of a transparent conductive material and a layer of a metal with high reflectance or may include a single layer of the transparent conductive material and the metal with high reflectance. The pixel electrode AND of the light-emitting element LED may have a stack structure such as ITO/Ag/ITO, ITO/Ag/IZO, or ITO/Ag/ITZO/IZO.

The emission layer EL may be disposed on the pixel electrode AND of the light-emitting element LED. For example, the emission layer EL may be an organic emission layer including an organic material, but the present disclosure is not limited thereto. In this example, as the TFT "TFT" applies a predetermined voltage to the pixel electrode AND of the light-emitting element LED and the common electrode CAT of the light-emitting element LED receives a common voltage or a low-potential electrode, holes and electrons may move to the emission layer EL through a hole transport layer and an electron transport layer, respectively, and may combine together in the emission layer EL to emit light.

The common electrode CAT may be disposed on the emission layer EL. The common electrode CAT may be implemented as a common electrode for all pixels SP and all code pixels CPX. For example, the common electrode CAT may be disposed on the emission layer EL and an IR emission layer IEL, in the emission areas EA of the pixel SP and the code pixel CPX, and may be disposed on the pixel-defining film PDL, in areas other than the emission areas EA of the pixel SP and the code pixel CPX. The common electrode CAT may receive a common voltage or a low-potential voltage. As the pixel electrode AND of the light-emitting element LED receives a data voltage and the common electrode CAT receives a low-potential voltage, an electric potential difference is formed between the pixel electrode AND of the light-emitting element LED and the common electrode CAT, and as a result, the emission layer EL can emit visible light. The common electrode CAT can transmit visible light therethrough.

The IR light-emitting element IRED may emit IR light and may form a code pattern having position information. The IR light-emitting element IRED may include a pixel electrode AND, an IR emission layer IEL, and a common electrode CAT. The pixel electrode AND of the IR light-emitting element IRED may be disposed on the second passivation layer PAS2. The pixel electrode AND of the IR light-emitting element IRED may be disposed to overlap with an emission area EA of the code pixel CPX, defined by the pixel-defining film PDL. The pixel electrode AND of the IR light-emitting element IRED may be connected to the drain electrode DE of the switching transistor ST through the first connecting electrodes CNE1 and the second connecting electrodes CNE2. The pixel electrode AND of the IR light-emitting element IRED may be formed of the same material as the pixel electrode AND of the light-emitting element LED, in the same layer as the pixel electrode AND of the light-emitting element LED.

The IR emission layer IEL may be disposed on the pixel electrode AND of the IR light-emitting element IRED. The IR emission layer IEL may include an organic material having an emission spectrum of 800 nm or greater, but the present disclosure is not limited thereto. The IR emission layer IEL may include a resonance auxiliary material doped with an IR light-emitting dopant. For example, the IR light-emitting dopant may include at least one of a metal complex compound, a donor-acceptor-donor (DAD) compound, and a lanthanide compound, but the present disclosure is not limited thereto. The metal complex compound may include at least one of platinum (Pt), palladium (Pd), Cu, and zinc (Zn). As the switching transistor ST applies a driving voltage to the pixel electrode AND of the IR light-emitting element IRED and the common electrode CAT receives a common voltage or a low-potential voltage, holes and electrons may move to the IR emission layer IEL through a hole transport layer and an electron transport layer, respectively, and may combine together in the IR emission layer IEL to emit IR light. The common electrode CAT may transmit IR light therethrough.

The pixel-defining film PDL may define a plurality of emission areas EA. The pixel-defining film PDL may separate and insulate the plurality of emission areas EA.

The planarization layer OC may be disposed on the common electrode CAT to cover the light-emitting element LED and the IR light-emitting element IRED. The planarization layer OC may planarize the top of the light-emitting element layer EML. For example, the planarization layer OC may include an organic material and may thus protect the light-emitting element layer EML from a foreign material such as dust.

The touch sensing unit TSU may be disposed on the display unit DU. The touch sensing unit TSU may include the second substrate SUB2 and the touch sensor layer TSL.

The second substrate SUB2 may be disposed on the planarization layer OC. The second substrate SUB2 may be a base substrate or a base member and may support the touch sensor layer TSL. The second substrate SUB2 may be a base member encapsulating the display unit DU. For example, the second substrate SUB2 may be a rigid substrate. The second substrate SUB2 may include a glass material or a metallic material, but the present disclosure is not limited thereto. In another example, the second substrate SUB2 may include an insulating material such as a polymer resin (e.g., polyimide (PI)).

The touch sensor layer TSL may be disposed on the second substrate SUB2. The touch sensor layer TSL may include a third buffer layer BF3, a first insulating film SIL1, touch electrodes SEN, and a second insulating film SIL2.

The third buffer layer BF3 may be disposed on the second substrate SUB2. The third buffer layer BF3 may have an insulating function and an optical function. The third buffer layer BF3 may include at least one inorganic film. Optionally, the third buffer layer BF3 may not be provided.

The first insulating film SIL1 may be disposed on the third buffer layer BF3. The first insulating film SIL1 may have an insulating function and an optical function. For example, the first insulating film SIL1 may be an inorganic film including at least one of a silicon nitride layer, a silicon oxynitride layer, a silicon oxide layer, a titanium oxide layer, and an aluminum oxide layer.

The touch electrodes SEN may be disposed on the first insulating film SILL. The touch electrodes SEN may be transparent electrodes including a transparent conductive material. The touch electrodes SEN can transmit light therethrough. The touch electrodes SEN may include a driving electrode TE and a sensing electrode RE. Each of the touch electrodes SEN may be formed as a single layer including Mo, Ti, Cu, or Al or as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO).

The second insulating film SIL2 may be disposed on the touch electrodes SEN and the first insulating film SILL. The second insulating film SIL2 may have an insulating function and an optical function. For example, the second insulating film SIL2 may be formed of one of the above-described exemplary materials that can be used to form the first insulating film SILL.

The polarizing film POL may be disposed on the touch sensing layer TSL. The polarizing film POL may be attached on the touch sensing layer TSL via an OCA film or an OCR. For example, the polarizing film POL may include a linear polarizing plate and a phase retardation film such as a λ/4 plate, and the linear polarizing plate and the phase retardation film may be sequentially stacked on the touch sensing layer TSL.

Figure 7:
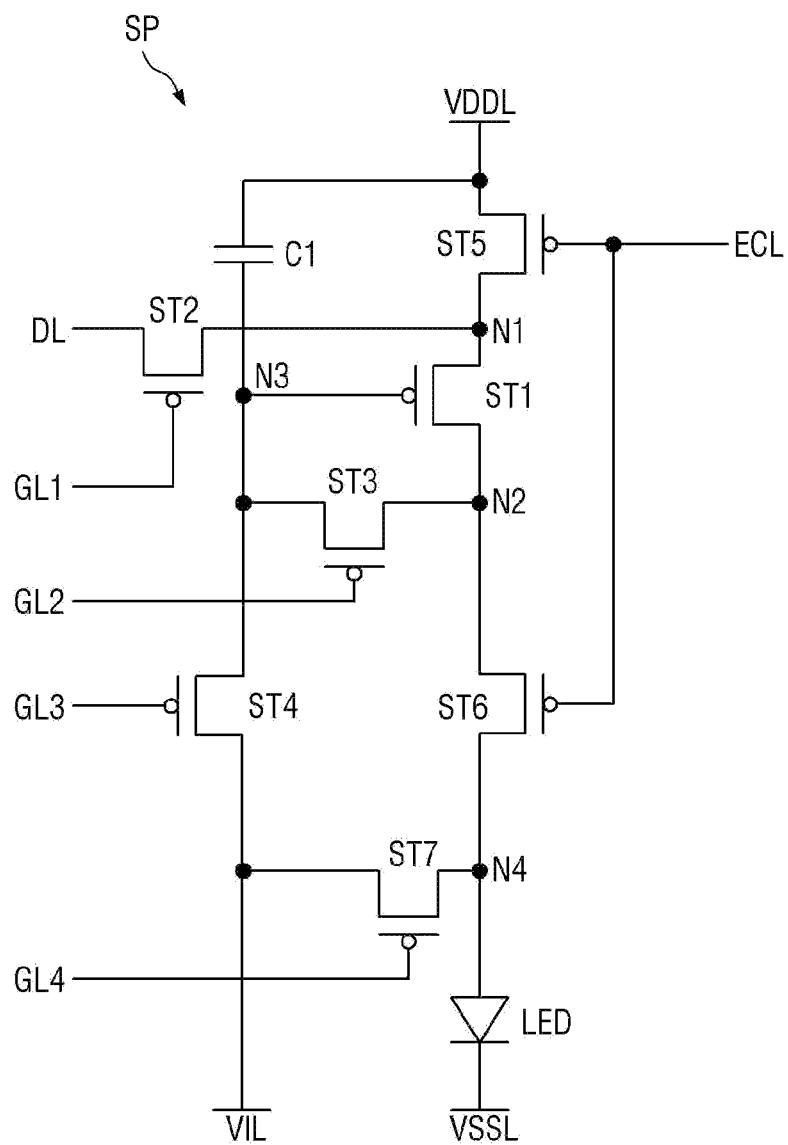
FIG. 7 is a circuit diagram of a pixel of the display device of FIG. 1.

FIG. 7 is a circuit diagram of a pixel of the display device of FIG. 1.

Referring to FIG. 7, the display panel 100 may include a pixel SP. The pixel SP may be connected to first, second, third, and fourth gate lines GL1, GL2, GL3, and GL4, an emission control line ECL, a data line DL, a driving voltage line VDDL, an initialization voltage line VIL, and a low-potential line VSSL.

The pixel SP may include first, second, third, fourth, fifth, sixth, and seventh transistors ST1, ST2, ST3, ST4, ST5, ST6, and ST7, a first capacitor C1, and a light-emitting element LED.

The first transistor ST1 may include a gate electrode, a source electrode, and a drain electrode. The first transistor ST1 may control a source-drain current or a driving current Isd in accordance with a data voltage applied to the gate electrode of the first transistor ST1. The driving current Isd, which flows through the channel of the first transistor ST1, may be proportional to the square of the difference between a threshold voltage Vth and a source-gate voltage Vsg, which is the voltage between the source and gate electrodes of the first transistor ST1. That is, $Isd=k'\times(Vsg-Vth)^2$ where $k'$ is a proportionality coefficient determined by the structure and physical characteristics of the first transistor ST1, Vsg is the source-gate voltage of the first transistor ST1, and Vth is the threshold voltage of the first transistor ST1.

The light-emitting element EL may receive the driving current Isd and may thus emit light. The amount of light emitted by the light-emitting element EL or the luminance of the light-emitting element EL may be proportional to the magnitude of the driving current Isd.

The light-emitting element EL may be an organic LED (OLED) including an anode, a cathode, and an organic emission layer, which is disposed between the anode and the cathode. Alternatively, the light-emitting element EL may be an inorganic LED including an anode, a cathode, and an inorganic semiconductor, which is disposed between the anode and the cathode. Still alternatively, the light-emitting element EL may be a quantum-dot LED including an anode, a cathode, and a quantum-dot emission layer, which is disposed between the anode and the cathode. Yet alternatively, the light-emitting element EL may be a microLED.

The anode of the light-emitting element EL may be connected to a fourth node N4. The anode of the light-emitting element EL may be connected to the drain electrode of the sixth transistor ST6 and the source electrode of the seventh transistor ST6 through the fourth node N4. The cathode of the light-emitting element EL may be connected to the low-potential line VSSL.

The second transistor ST2 may be turned on a first gate signal from the first gate line GL1 to connect the data line DL and a first node N1, which is the source electrode of the first transistor ST1. As the second transistor ST2 is turned on by the first gate signal, the second transistor ST2 may supply a data voltage to the first node N1. The gate electrode of the second transistor ST2 may be connected to the first gate line GL1, the source electrode of the second transistor ST2 may be connected to the data line DL, and the drain electrode of the second transistor ST2 may be connected to the first node N1. The drain electrode of the second transistor ST2 may be connected to the source electrode of the first transistor ST1 and the drain electrode of the fifth transistor ST5 through the first node N1.

The third transistor ST3 may be turned on by a second gate signal from the second gate line GL2 to connect the second node N2, which is the drain electrode of the first transistor ST1, and a third node N3, which is the gate electrode of the first transistor ST1. The gate electrode of the third transistor ST3 may be connected to the second gate line GL2, the source electrode of the third transistor ST3 may be connected to the second node N2, and the drain electrode of the third transistor ST3 may be connected to the third node N3. The source electrode of the third transistor ST3 may be connected to the drain electrode of the first transistor ST1 and the source electrode of the sixth transistor ST6 through the second node N2. The drain electrode of the third transistor ST3 may be connected to the gate electrode of the first transistor ST1, the source electrode of the fourth transistor ST4, and the first electrode of the first capacitor C1 through the third node N3.

The fourth transistor ST4 may be turned on by a third gate signal from the third gate line GL3 to connect the initialization voltage line VIL and the third node N3, which is the gate electrode of the first transistor ST1. As the fourth transistor ST4 is turned on by the third gate signal, the fourth transistor ST4 may discharge the gate electrode of the first transistor ST1 to as low as an initialization voltage. The gate electrode of the fourth transistor ST4 may be connected to the third gate line GL3, the source electrode of the fourth transistor ST4 may be connected to the third node N3, and the drain electrode of the fourth transistor ST4 may be connected to the initialization voltage line VIL. The source electrode of the fourth transistor ST4 may be connected to the gate electrode of the first transistor ST1, the drain electrode of the third transistor ST3, and the first electrode of the first capacitor C1 through the third node N3.

The fifth transistor ST5 may be turned on by an emission signal from the emission control line ECL to connect the driving voltage line VDDL and the first node N1, which is the source electrode of the first transistor ST1. The gate electrode of the fifth transistor ST5 may be connected to the emission control line ECL, the source electrode of the fifth transistor ST5 may be connected to the driving voltage line VDDL, and the drain electrode of the fifth transistor ST5 may be connected to the first node N1. The drain electrode of the fifth transistor ST5 may be connected to the source electrode of the first transistor ST1 and the drain electrode of the second transistor ST2 through the first node N1.

The sixth transistor ST6 may be turned on by the emission signal from the emission control line ECL to connect the second node N2, which is the drain electrode of the first transistor ST1, and the fourth node N4, which is the anode of the light-emitting element EL. The gate electrode of the sixth transistor ST6 may be connected to the emission control line ECL, the source electrode of the sixth transistor ST6 may be connected to the second node N2, and the drain electrode of the sixth transistor ST6 may be connected to the fourth node N4. The source electrode of the sixth transistor ST6 may be connected to the drain electrode of the first transistor ST1 and the source electrode of the third transistor ST3 through the second node N2. The drain electrode of the sixth transistor ST6 may be connected to the anode of the light-emitting element EL and the source electrode of the seventh transistor ST7 through the fourth node N4.

In a case where the first, fifth, and sixth transistors ST1, ST5, and ST6 are all turned on, the driving current Isd may be applied to the light-emitting element EL.

The seventh transistor ST7 may be turned on by a fourth gate signal from the fourth gate line GL4 to connect the initialization voltage line VIL and the fourth node N4, which is the anode of the light-emitting element EL. As the seventh transistor ST7 may be turned on by the fourth gate signal, the seventh transistor ST6 may discharge the anode of the light-emitting element EL to as low as the initialization voltage. The gate electrode of the seventh transistor ST7 may be connected to the fourth gate line GL4, the source electrode of the seventh transistor ST7 may be connected to the fourth node N4, and the drain electrode of the seventh transistor ST7 may be connected to the initialization voltage line VIL. The source electrode of the seventh transistor ST7 may be connected to the anode of the light-emitting element EL and the drain electrode of the sixth transistor ST6 through the fourth node N4.

The first capacitor C1 may be connected between the third node N3 and the driving voltage line VDDL. For example, the first electrode of the first capacitor C1 may be connected to the third node N3, and the second electrode of the first capacitor C1 may be connected to the driving voltage line VDDL. The first capacitor C1 may store a differential voltage between the third node N3 and the driving voltage line VDDL and may thus be able to stably control the voltage at the gate electrode of the first transistor ST1.

Figure 8:
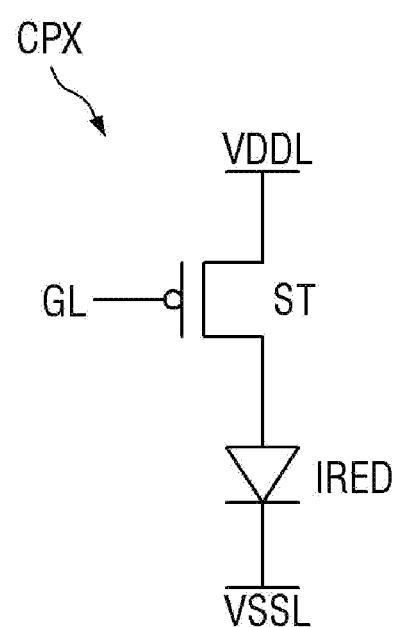
FIG. 8 is a circuit diagram of a code pixel of the display device of FIG. 1.

FIG. 8 is a circuit diagram of a code pixel of the display device of FIG. 1.

Referring to FIG. 8, the display panel 100 may include a code pixel CPX. The code pixel CPX may be connected to a gate line GL, a driving voltage line VDDL, and a low-potential line VSSL.

The code pixel CPX may include a switching transistor ST and an IR light-emitting element IRED.

The switching transistor ST may be turned on by a gate signal from the gate line GL to connect the driving voltage line VDDL and the IR light-emitting element IRED. As the switching transistor ST is turned on by the gate signal, the switching transistor ST may supply a driving voltage to the anode of the IR light-emitting element IRED. The gate electrode of the switching transistor ST may be connected to the gate line GL, the source electrode of the switching transistor ST may be connected to the driving voltage line VDDL, and the drain electrode of the switching transistor ST may be connected to the anode of the IR light-emitting element IRED.

The IR light-emitting element IRED may receive the driving voltage from the switching transistor ST and may thus emit IR light. As the code pixel CPX includes the switching transistor ST, the code pixel CPX can control the timing of emission of IR light.

The IR light-emitting element IRED may be an OLED including an anode, a cathode, and an organic emission layer, which is disposed between the anode and the cathode. Alternatively, the IR light-emitting element IRED may be an inorganic LED including an anode, a cathode, and an inorganic semiconductor, which is disposed between the anode and the cathode. Still alternatively, the IR light-emitting element IRED may be a quantum-dot LED including an anode, a cathode, and a quantum-dot emission layer, which is disposed between the anode and the cathode. Yet alternatively, the IR light-emitting element IRED may be a microLED.

Therefore, as the display device 10 includes the code pixels CPX, which are disposed in the same layer as the pixels SP, the display device 10 can be applied to nearly all types of electronic devices without any size limitations.

Figure 9:
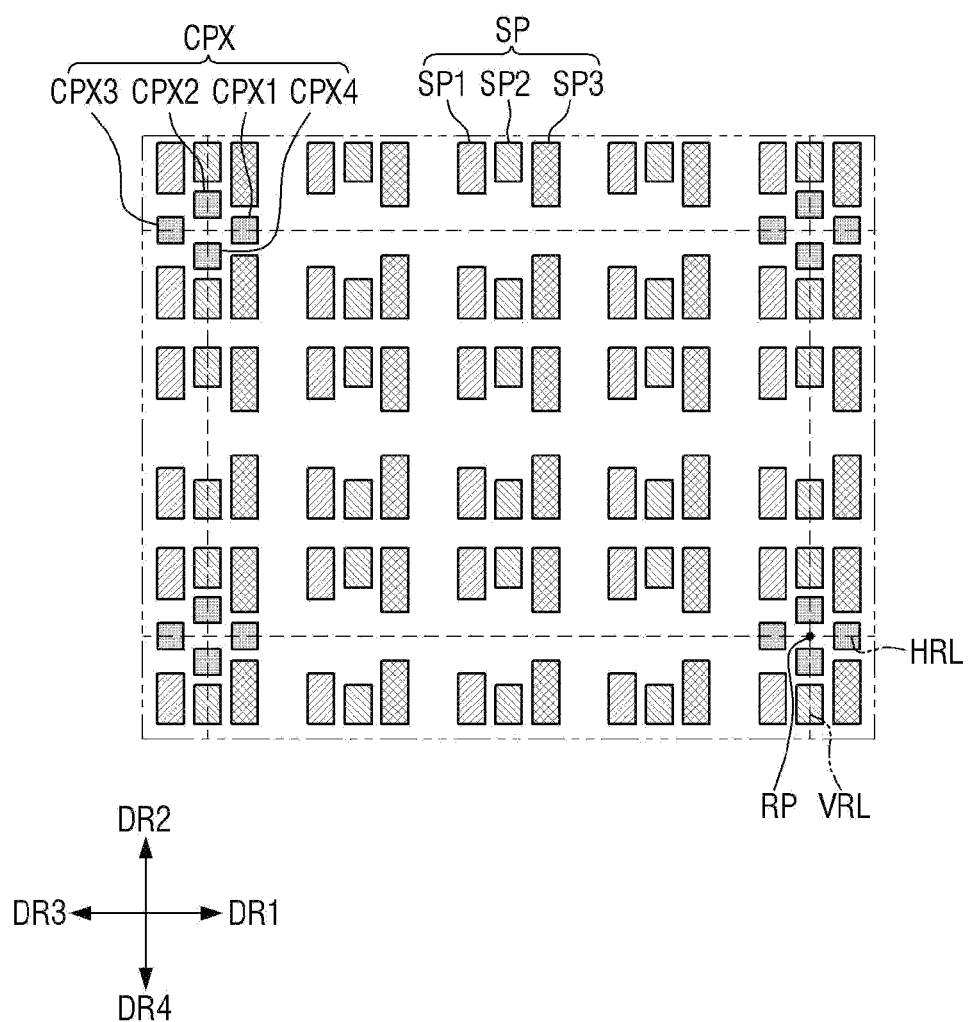
FIG. 9 is a layout view of a display area of a display device according to another embodiment of the present disclosure.
Figure 10:
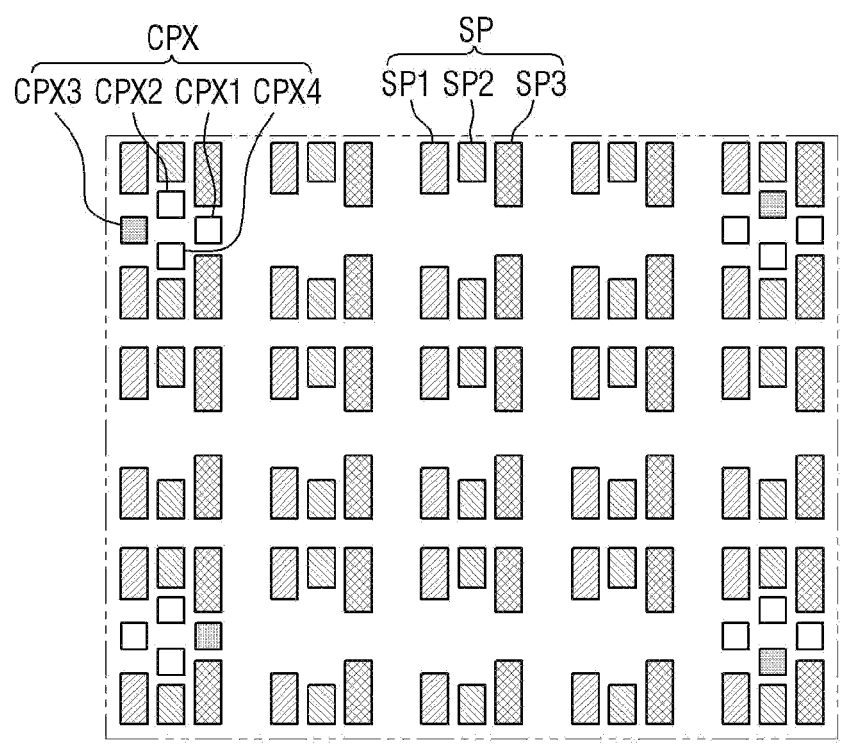
FIG. 10 is a layout view illustrating how to drive code pixels of the display device of FIG. 9.
Figure 10:
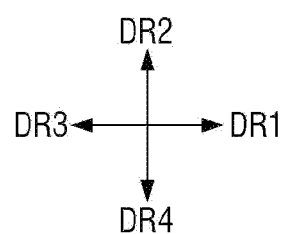

FIG. 9 is a layout view of a display area of a display device according to another embodiment of the present disclosure, and FIG. 10 is a layout view illustrating how to drive code pixels of the display device of FIG. 9.

Referring to FIGS. 9 and 10, a display area DA may include a plurality of pixels SP and a plurality of code pixels CPX.

The pixels SP may emit light so that a display device 10 may display an image. The pixels SP may include first pixels SP1, second pixels SP2, and third pixels SP3. The first pixels SP1, the second pixels SP2, and the third pixels SP3 may emit light through their respective emission areas. The sizes of the emission areas of the first pixels SP1, the second pixels SP2, and the third pixels SP3 may differ. For example, the emission areas of the third pixels SP3 may be larger than the emission areas of the first pixels SP1, and the emission areas of the first pixels SP1 may be larger than the emission areas of the second pixels SP2. However, the present disclosure is not limited to this example. A unit pixel may include at least one first pixel SP1, at least one second pixel SP2, and at least one third pixel SP3 and may display white gradation.

In one unit pixel, first, second, and third pixels SP1, SP2, and SP3 may be sequentially arranged in a first direction DR1. A third pixel SP3 of one unit pixel may be adjacent to a first pixel SP1 of a neighboring unit pixel in the first direction DR1. A plurality of first pixels SP1 may be arranged in the same column, a plurality of second pixels SP2 may be arranged in the same column adjacent to the column of the plurality of first pixels SP1 in the first direction DR1, and a plurality of third pixels SP3 may be arranged in the same column adjacent to the column of the plurality of second pixels SP2 in the first direction DR1. A pair of adjacent columns of first pixels SP1, second pixels SP2, or third pixels SP3 may be symmetrical to each other with respect to an axis in the first direction DR1.

The code pixels CPX may be disposed in the same layer as the pixels SP, which display an image. The code pixels CPX may emit light of a particular wavelength range and may thus form a code pattern having position information. The code pixels CPX may emit IR light, but the present disclosure is not limited thereto. The code pixels CPX may be arranged over the entire display area DA. The plurality of code pixels CPX per unit area may be smaller than the number of pixels SP per unit area. The plurality of code pixels CPX per unit area may be determined by the resolution of pixels SP. A plurality of code pixels CPX may be disposed adjacent, in particular directions, to each reference point RP between multiple pixels SP.

Reference points RP may be the intersections between first reference lines HRL and second reference lines VRL. The first reference lines HRL and the second reference lines VRL may be invisible imaginary lines. The first reference lines HRL may extend in the first direction DR1. Each of the first reference lines HRL may intersect the second reference lines VRL, thereby forming a plurality of reference points RP. The first reference lines HRL may be arranged at intervals of a plurality of rows of pixels SP. The second reference lines VRL may extend in a second direction DR2. The second reference lines VRL may overlap with some of columns of second pixels SP2, but the present disclosure is not limited thereto. A plurality of code pixels CPX that are adjacent to one another in the first direction DR1 or a second direction DR2 may be arranged at intervals of a plurality of unit pixels, each including first, second, and third pixels SP1, SP2, and SP3. For example, two adjacent code pixels CPX in the first direction DR1 may be arranged at intervals of four unit pixels, and two adjacent code pixels CPX in the second direction DR2 may also be arranged at intervals of four unit pixels. However, the present disclosure is not limited to this example.

The code pixels CPX may include code pixel arrays, which are arrays of first, second, third, and fourth code pixels CPX1, CPX2, CPX3, and CPX4. Each of the code pixel arrays may surround one of the reference points RP. Each of the code pixel arrays may be arranged adjacent, in particular directions, to one of the reference points RP. For example, in each of the code pixel arrays, first, second, third, and fourth code pixels CPX1, CPX2, CPX3, and CPX4 may be arranged adjacent to one reference point RP in the first direction DR1, the second direction DR2, a third direction DR3, and a third direction DR4, respectively. A first code pixel CPX1 may overlap with a first pixel SP1 in the second direction DR2. Second and fourth code pixels CPX2 and CPX4 of each of the code pixel arrays may overlap with a second pixel SP2 in the second direction DR2. A third code pixel CPX3 of each of the code pixel arrays may overlap with a third pixel SP3 in the second direction DR2.

Referring to the upper left code pixel array of FIG. 10, the third code pixel CPX3 may emit IR light, and the first, second, and fourth code pixels CPX1, CPX2, and CPX4 may not emit IR light. Also, referring to the lower right code pixel array of FIG. 10, the fourth code pixel CPX4 may emit IR light, and the first, second, and third code pixels CPX1, CPX2, and CPX3 may not emit IR light. An image of the code pixels CPX may be photographed by a camera near the front of the display device 10, and the code pixels CPX may be identified from the photographed image. At least one of the code pixels CPX included in each of the code pixel arrays may emit IR light and may thus correspond to a predefined data code. For example, at least one code pixel CPX or a combination of code pixels CPX may correspond to a data code designated for a particular position.

As the display device 10 includes the code pixels CPX, which are disposed in the same layer as the pixels SP displaying an image and emit light of a particular wavelength range, the display device 10 can receive input from an input device such as an input pen. At least one code pixel CPX or a combination of code pixels CPX may have position information in accordance with a predetermined set of criteria and may thus correspond one-to-one to a predefined data code. Thus, the display device 10 can receive coordinate data generated simply using data codes, without a requirement of any complicated computation/correction process, and can properly perform a function corresponding to the exact input coordinates, can reduce cost and power consumption, and can simplify its driving process. Also, as the display device 10 includes the code pixels CPX, which are disposed in the same layer as the pixels SP, the display device 10 can be applied to nearly all types of electronic devices without any size limitations.

Figure 11:
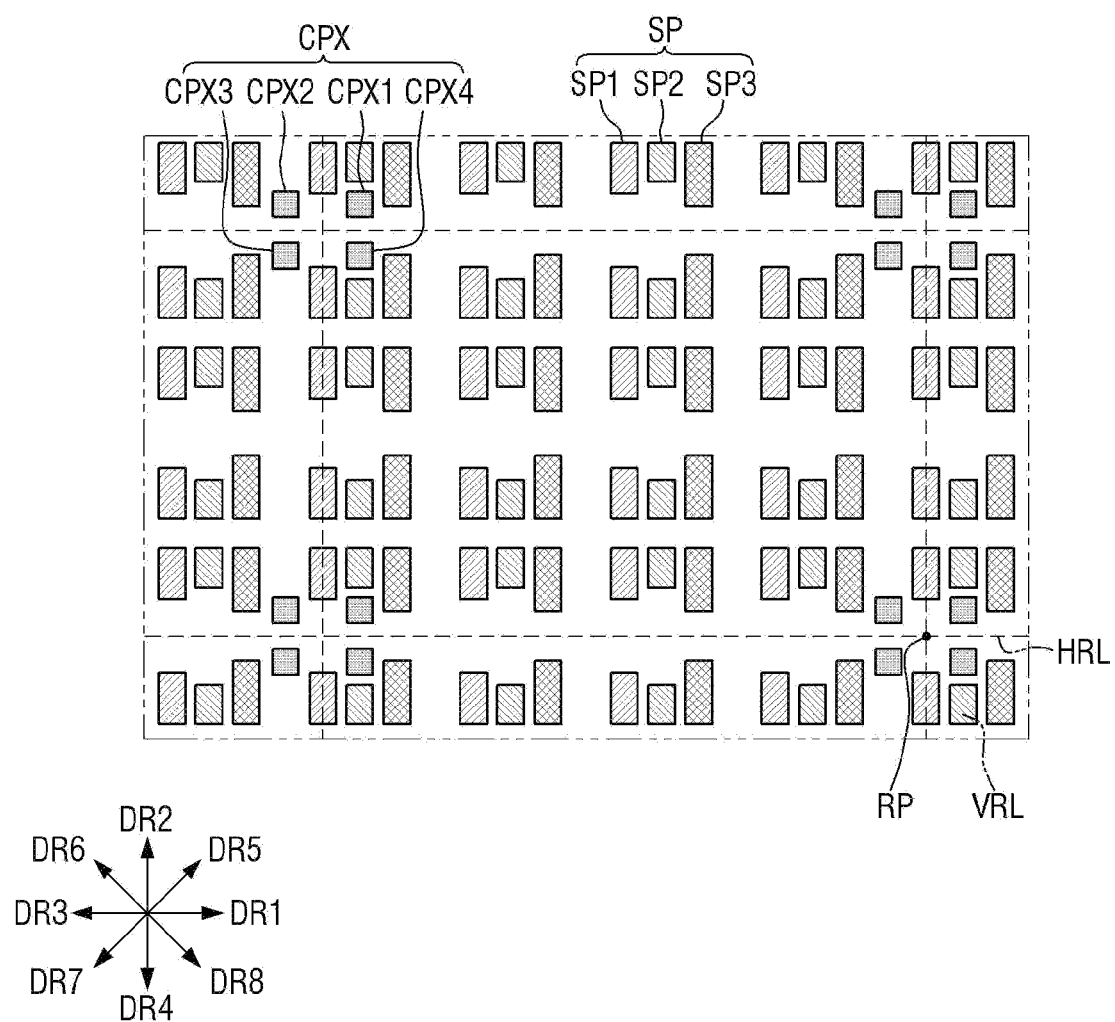
FIG. 11 is a layout view of a display area of a display device according to another embodiment of the present disclosure.
Figure 12:
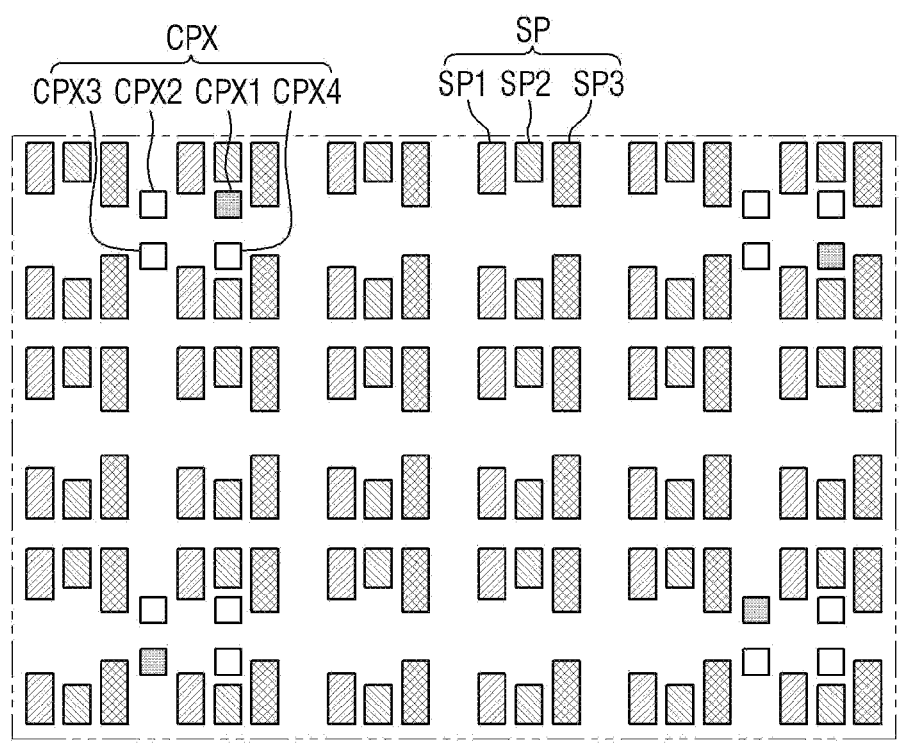
FIG. 12 is a layout view illustrating how to drive code pixels of the display device of FIG. 11.
Figure 12:
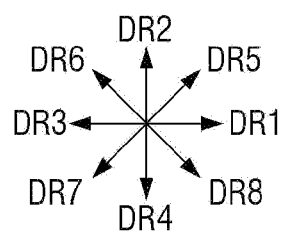

FIG. 11 is a layout view of a display area of a display device according to another embodiment of the present disclosure, and FIG. 12 is a layout view illustrating how to drive code pixels of the display device of FIG. 11. The embodiment of FIGS. 11 and 12 differs from the embodiment of FIGS. 9 and 10 in the configuration of code pixels CPX and thus will hereinafter be described, focusing mainly on the differences with the embodiment of FIGS. 9 and 10.

Referring to FIGS. 11 and 12, a display area DA may include a plurality of pixels SP and a plurality of code pixels CPX.

The code pixels CPX may be disposed in the same layer as the pixels SP, which display an image. The code pixels CPX may emit light of a particular wavelength range and may thus form a code pattern having position information. The code pixels CPX may emit IR light, but the present disclosure is not limited thereto. The code pixels CPX may be arranged over the entire display area DA. The plurality of code pixels CPX per unit area may be smaller than the plurality of pixels SP per unit area. The plurality of code pixels CPX per unit area may be determined by the resolution of pixels SP. A plurality of code pixels CPX may be disposed adjacent, in particular directions, to each reference point RP between multiple pixels SP.

Reference points RP may be the intersections between first reference lines HRL and second reference lines VRL. The first reference lines HRL and the second reference lines VRL may be invisible imaginary lines. The first reference lines HRL may extend in the first direction DR1. Each of the first reference lines HRL may intersect the second reference lines VRL, thereby forming a plurality of reference points RP. The first reference lines HRL may be arranged at intervals of a plurality of rows of pixels SP. The second reference lines VRL may extend in a second direction DR2. Each of the second reference lines VRL may intersect the first reference lines HRL, thereby forming the plurality of reference points RP. The second reference lines VRL may overlap with some of the columns of first pixels SP1, but the present disclosure is not limited thereto. A plurality of code pixels CPX that are adjacent to one another in the first direction DR1 or a second direction DR2 may be arranged at intervals of a plurality of unit pixels, each including first, second, and third pixels SP1, SP2, and SP3. For example, two adjacent code pixels CPX in the first direction DR1 may be arranged at intervals of four unit pixels, and two adjacent code pixels CPX in the second direction DR2 may also be arranged at intervals of four unit pixels. However, the present disclosure is not limited to this example.

The code pixels CPX may include code pixel arrays, which are arrays of first, second, third, and fourth code pixels CPX1, CPX2, CPX3, and CPX4. Each of the code pixel arrays may surround one of the reference points RP. Each of the code pixel arrays may be arranged adjacent, in particular directions, to one of the reference points RP. For example, in each of the code pixel arrays, first, second, third, and fourth code pixels CPX1, CPX2, CPX3, and CPX4 may be arranged adjacent to one reference point RP in fifth, sixth, seventh, and eighth directions DR5, DR6, DR7, and DR8, respectively. The first and fourth code pixels CPX1 and CPX4 of each of the code pixel arrays may overlap with a second pixel SP2 in the second direction DR2. The second and third code pixels CPX2 and CPX3 of each of the code pixel arrays may overlap with none of first, second, and third pixels SP1, SP2, and SP3 in the second direction DR2.

Referring to the upper left code pixel array of FIG. 12, the first code pixel CPX1 may emit IR light, and the second, third, and fourth code pixels CPX2, CPX3, and CPX4 may not emit IR light. Also, referring to the lower right code pixel array of FIG. 12, the second code pixel CPX2 may emit IR light, and the first, third, and third code pixels CPX1, CPX3, and CPX3 may not emit IR light. An image of the code pixels CPX may be photographed by a camera near the front of the display device 10, and the code pixels CPX may be identified from the photographed image. At least one of the code pixels CPX included in each of the code pixel arrays may emit IR light and may thus correspond to a predefined data code. For example, at least one code pixel CPX or a combination of code pixels CPX may correspond to a data code designated for a particular position.

As the display device 10 includes the code pixels CPX, which are disposed in the same layer as the pixels SP displaying an image and emit light of a particular wavelength range, the display device 10 can receive input from an input device such as an input pen. At least one code pixel CPX or a combination of code pixels CPX may have position information in accordance with a predetermined set of criteria and may thus correspond one-to-one to a predefined data code. Thus, the display device 10 can receive coordinate data generated simply using data codes, without a requirement of any complicated computation/correction process, and can properly perform a function corresponding to the exact input coordinates, can reduce cost and power consumption, and can simplify its driving process. Also, as the display device 10 includes the code pixels CPX, which are disposed in the same layer as the pixels SP, the display device 10 can be applied to nearly all types of electronic devices without any size limitations.

Figure 13:
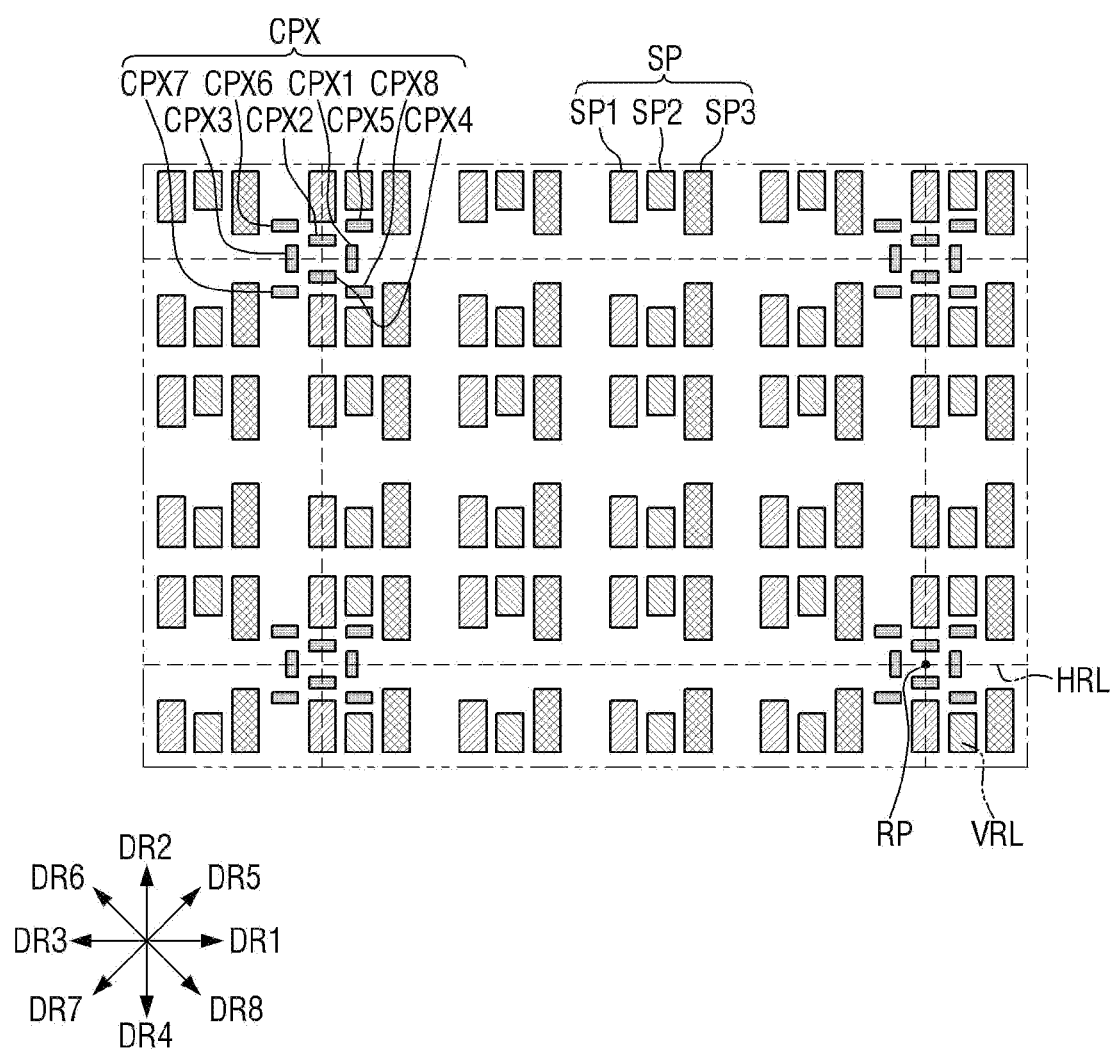
FIG. 13 is a layout view of a display area of a display device according to another embodiment of the present disclosure.
Figure 14:
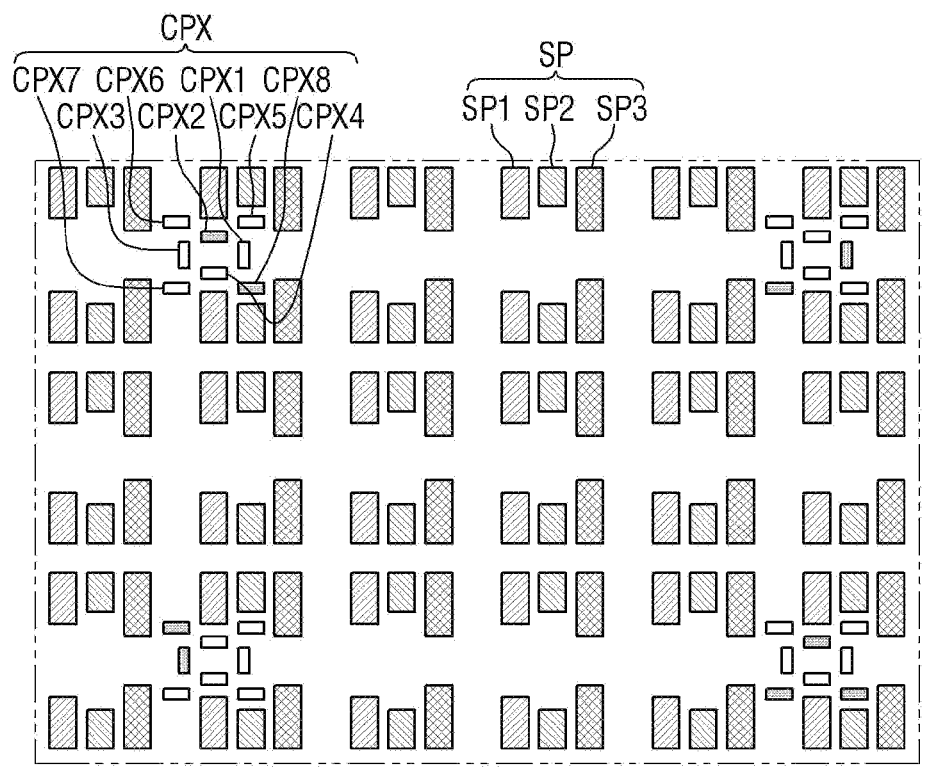
FIG. 14 is a layout view illustrating how to drive code pixels of the display device of FIG. 13.
Figure 14:
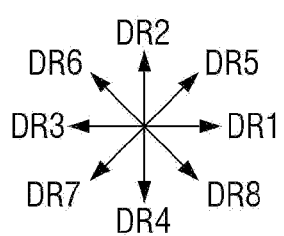

FIG. 13 is a layout view of a display area of a display device according to another embodiment of the present disclosure, and FIG. 14 is a layout view illustrating how to drive code pixels of the display device of FIG. 13. The embodiment of FIGS. 13 and 14 differs from the embodiment of FIGS. 9 and 10 in the configuration of code pixels CPX and thus will hereinafter be described, focusing mainly on the differences with the embodiment of FIGS. 9 and 10.

Referring to FIGS. 13 and 14, a display area DA may include a plurality of pixels SP and a plurality of code pixels CPX.

The code pixels CPX may be disposed in the same layer as the pixels SP, which display an image. The code pixels CPX may emit light of a particular wavelength range and may thus form a code pattern having position information. The code pixels CPX may emit IR light, but the present disclosure is not limited thereto. The code pixels CPX may be arranged over the entire display area DA. The plurality of code pixels CPX per unit area may be smaller than the plurality of pixels SP per unit area. The plurality of code pixels CPX per unit area may be determined by the resolution of pixels SP. A plurality of code pixels CPX may be disposed adjacent, in particular directions, to each reference point RP between multiple pixels SP.

Reference points RP may be the intersections between first reference lines HRL and second reference lines VRL. The first reference lines HRL and the second reference lines VRL may be invisible imaginary lines. The first reference lines HRL may extend in the first direction DR1. Each of the first reference lines HRL may intersect the second reference lines VRL, thereby forming a plurality of reference points RP. The first reference lines HRL may be arranged at intervals of a plurality of rows of pixels SP. The second reference lines VRL may extend in a second direction DR2. Each of the second reference lines VRL may intersect the first reference lines HRL, thereby forming the plurality of reference points RP. The second reference lines VRL may overlap with some of the columns of first pixels SP1, but the present disclosure is not limited thereto. A plurality of code pixels CPX that are adjacent to one another in the first direction DR1 or a second direction DR2 may be arranged at intervals of a plurality of unit pixels, each including first, second, and third pixels SP1, SP2, and SP3. For example, two adjacent code pixels CPX in the first direction DR1 may be arranged at intervals of four unit pixels, and two adjacent code pixels CPX in the second direction DR2 may also be arranged at intervals of four unit pixels. However, the present disclosure is not limited to this example.

The code pixels CPX may include code pixel arrays, which are arrays of first, second, third, fourth, fifth, sixth, seventh, and eighth code pixels CPX1, CPX2, CPX3, CPX4, CPX5, CPX6, CPX7, and CPX8. Each of the code pixel arrays may surround one of the reference points RP. Each of the code pixel arrays may be arranged adjacent, in particular directions, to one of the reference points RP. For example, in each of the code pixel arrays, first, second, third, fourth, fifth, sixth, seventh, and eighth code pixels CPX1, CPX2, CPX3, CPX4, CPX5, CPX6, CPX7, and CPX8 may be arranged adjacent to one reference point RP in first, second, third, fourth, fifth, sixth, seventh, and eighth directions DR1, DR2, DR3, DR4, DR5, DR6, DR7, and DR8, respectively. The first, fifth, and eighth code pixels CPX1, CPX5, and CPX8 of each of the code pixel arrays may overlap with a second pixel SP2 in the second direction DR2. The second and fourth code pixels CPX2 and CPX3 of each of the code pixel arrays may overlap with a first pixel SP1 in the second direction DR2. The third, sixth, and seventh pixels CPX3, CPX6, and CPX7 of each of the code pixel arrays may overlap with none of first, second, and third pixels SP1, SP2, and SP3 in the second direction DR2.

Referring to the upper left code pixel array of FIG. 14, the second and eighth code pixels CPX2 and CPX8 may emit IR light, and the other code pixels may not emit IR light. Also, referring to the lower right code pixel array of FIG. 12, the second, seventh, and eighth code pixels CPX2, CPX7, and CPX8 may emit IR light, and the other code pixels may not emit IR light. An image of the code pixels CPX may be photographed by a camera near the front of the display device 10, and the code pixels CPX may be identified from the photographed image. At least one of the code pixels CPX included in each of the code pixel arrays may emit IR light and may thus correspond to a predefined data code. For example, at least one code pixel CPX or a combination of code pixels CPX may correspond to a data code designated for a particular position.

As the display device 10 includes the code pixels CPX, which are disposed in the same layer as the pixels SP displaying an image and emit light of a particular wavelength range, the display device 10 can receive input from an input device such as an input pen. At least one code pixel CPX or a combination of code pixels CPX may have position information in accordance with a predetermined set of criteria and may thus correspond one-to-one to a predefined data code. Thus, the display device 10 can receive coordinate data generated simply using data codes, without a requirement of any complicated computation/correction process, and can properly perform a function corresponding to the exact input coordinates, can reduce cost and power consumption, and can simplify its driving process. Also, as the display device 10 includes the code pixels CPX, which are disposed in the same layer as the pixels SP, the display device 10 can be applied to nearly all types of electronic devices without any size limitations.

Figure 15:
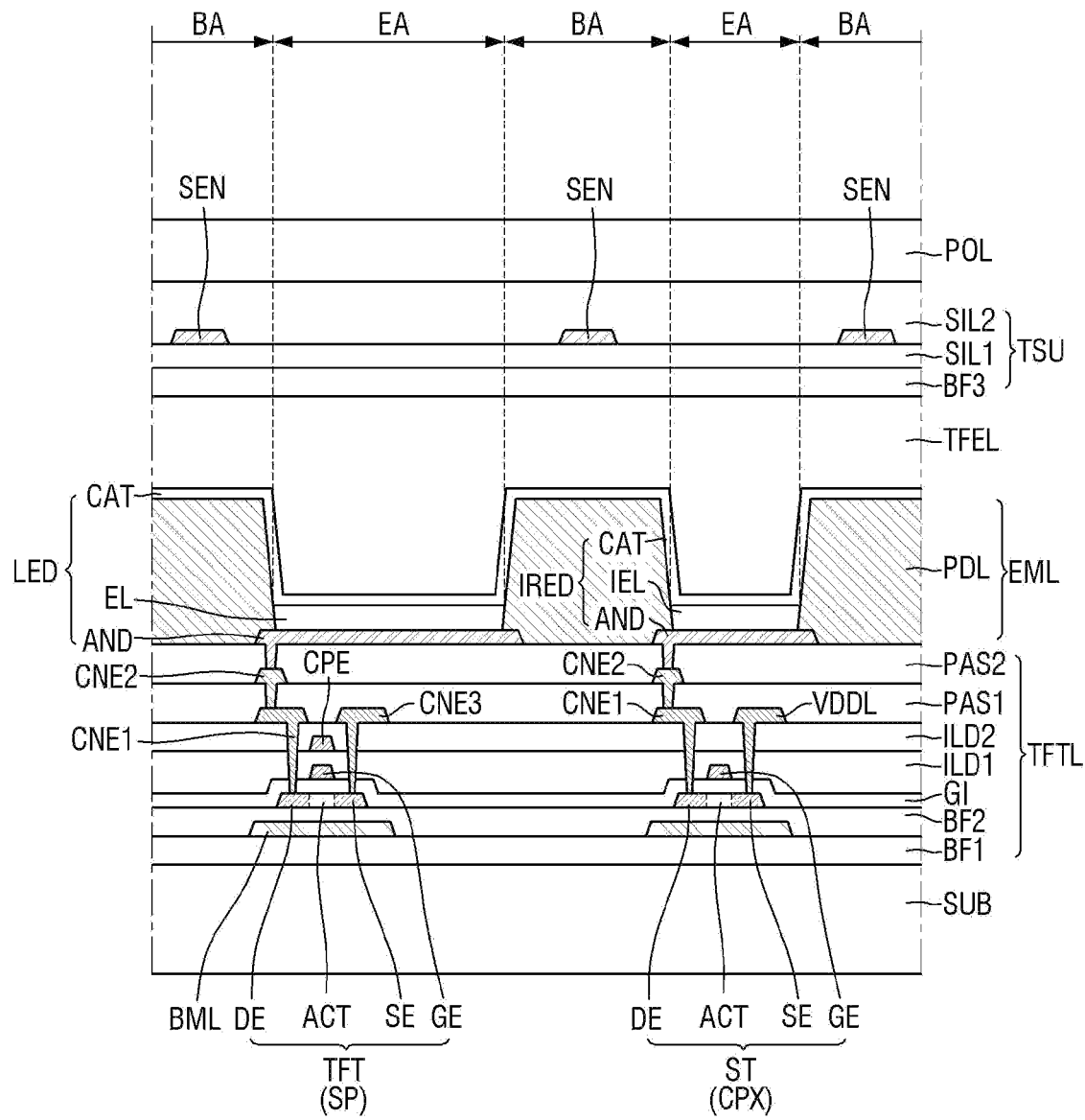
FIG. 15 is a cross-sectional view of a display area of a display device according to another embodiment of the present disclosure.

FIG. 15 is a cross-sectional view of a display area of a display device according to another embodiment of the present disclosure. The embodiment of FIG. 15 differs from the embodiment of FIG. 6 in the configurations of a light-emitting element layer EML and a touch sensing unit TSU. Descriptions of features or elements that have already been described above will be omitted or simplified.

Referring to FIG. 15, a display panel 100 may include a display unit DU, a touch sensing unit TSU, and a polarizing film POL. The display unit DU may include a substrate SUB, a TFT layer TFTL, a light-emitting element layer EML, and an encapsulation layer TFEL.

The TFT layer TFTL may be disposed on the first substrate SUB1. The TFT layer TFTL may include a first buffer layer BF1, a light-blocking layer BML, a second buffer layer BF2, a TFT "TFT", a switching transistor ST, a gate insulating film G, a first interlayer insulating film ILD1, a capacitor electrode CPE, a second interlayer insulating film ILD2, first connecting electrodes CNE1, second connecting electrodes CNE2, third connecting electrodes CNE3, a first passivation layer PAS1, and a second passivation layer PAS2.

The light-emitting element layer EML may be disposed on the TFT layer TFTL. The light-emitting element layer EML may include a light-emitting element LED, an IR light-emitting element IRED, and a pixel-defining film PDL.

The encapsulation layer TFEL may be disposed on a common electrode CAT to cover the light-emitting element LED and the IR light-emitting element IRED. The encapsulation layer TFEL may include at least one inorganic film and may thus prevent oxygen or moisture from infiltrating into the light-emitting element layer EML. The encapsulation layer TFEL may also include at least one organic film and may thus protect the light-emitting element layer EML from a foreign material such as dust.

The touch sensing unit TSU may be disposed on the encapsulation layer TFEL. The touch sensing unit TSU may include a third buffer layer BF3, a first insulating film SIL1, touch electrodes SEN, and a second insulating film SIL2.

The third buffer layer BF3 may be disposed on the encapsulation layer TFEL. The third buffer layer BF3 may have an insulating function and an optical function. The third buffer layer BF3 may include at least one inorganic film. Optionally, the third buffer layer BF3 may not be provided.

The touch electrodes SEN may be disposed on the first insulating film SILL. The touch electrodes SEN may be transparent electrodes. For example, the touch electrodes SEN may include a transparent conductive material and may thus be able to transmit light therethrough. Each of the touch electrodes SEN may be formed as a single layer including Mo, Ti, Cu, or Al or as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO).

The touch electrodes SEN may be formed into a mesh or fishnet structure in a plan view. The touch electrodes SEN may surround each of a plurality of emission areas EA in a plan view. Thus, the touch electrodes SEN may surround a plurality of pixels SP or a plurality of code pixels CPX in a plan view. Thus, a display device 10 can prevent the luminance of light emitted from the plurality of pixels SP from being lowered by the touch sensing unit TSU.

Figure 16:
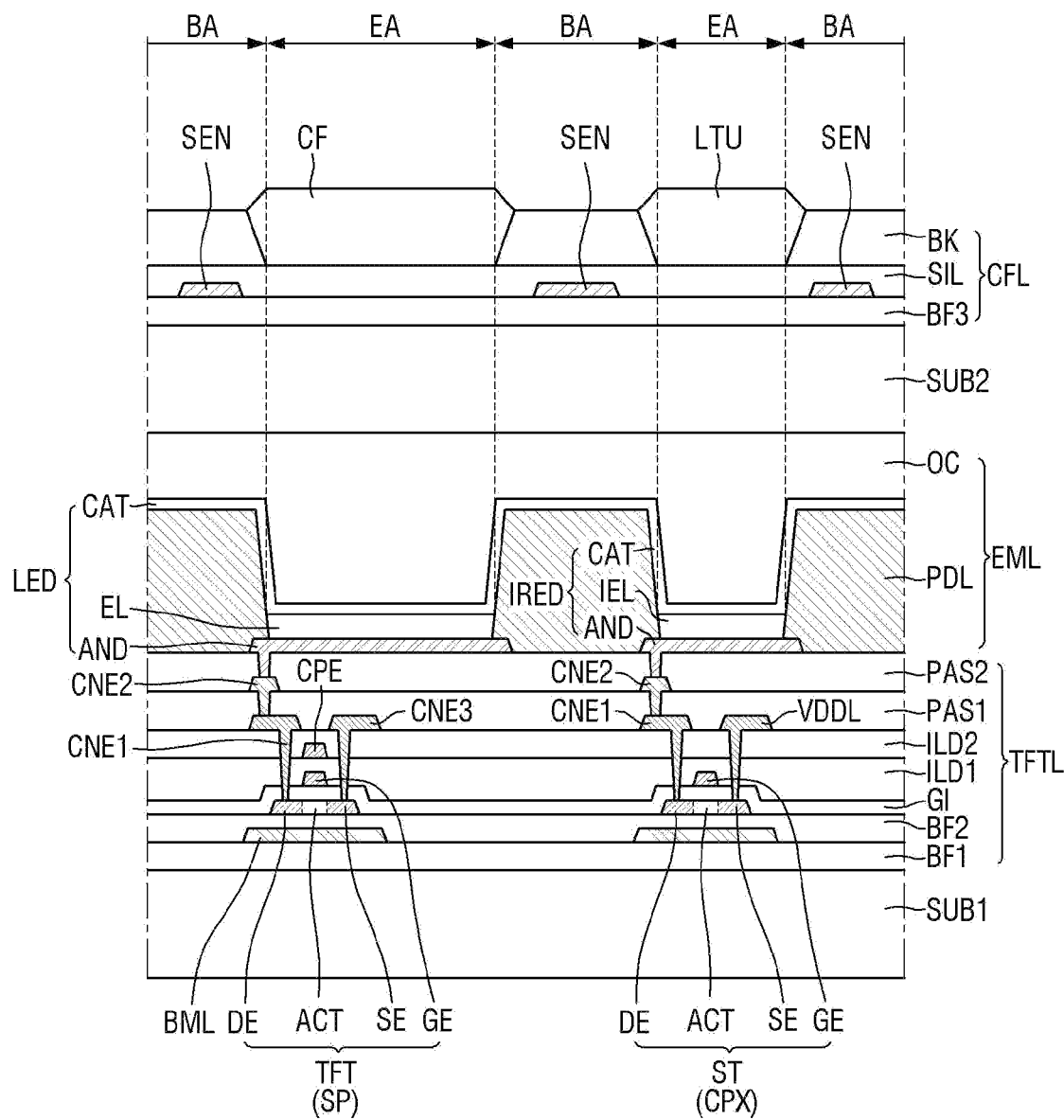
FIG. 16 is a cross-sectional view of a display area of a display device according to another embodiment of the present disclosure.

FIG. 16 is a cross-sectional view of a display area of a display device according to another embodiment of the present disclosure. The embodiment of FIG. 16 differs from the embodiment of FIG. 6 in the configuration of a second substrate SUB2 and thus will hereinafter be described, focusing mainly on the differences with the embodiment of FIG. 6.

Referring to FIG. 16, a display panel 100 may include a first substrate SUB1, a TFT layer TFTL, a light-emitting element layer EML, a second substrate SUB2, and a color filter layer CFL.

The first substrate SUB1 may be a base substrate or a base member. For example, the first substrate SUB1 may be a rigid substrate. The first substrate SUB1 may include a glass material or a metallic material, but the present disclosure is not limited thereto. In another example, the first substrate SUB1 may include an insulating material such as a polymer resin (e.g., PI).

The TFT layer TFTL may be disposed on the first substrate SUB1. The TFT layer TFTL may include a first buffer layer BF1, a light-blocking layer BML, a second buffer layer BF2, a TFT "TFT", a switching transistor ST, a gate insulating film G, a first interlayer insulating film ILD1, a capacitor electrode CPE, a second interlayer insulating film ILD2, first connecting electrodes CNE1, second connecting electrodes CNE2, third connecting electrodes CNE3, a first passivation layer PAS1, and a second passivation layer PAS2.

The light-emitting element layer EML may be disposed on the TFT layer TFTL. The light-emitting element layer EML may include a light-emitting element LED, an IR light-emitting element IRED, a pixel-defining film PDL, and a planarization layer OC.

The second substrate SUB2 may be disposed on the light-emitting element layer EML. The second substrate SUB2 may be a base substrate or a base member and may support the color filter layer CFL. The second substrate SUB2 may be a base member encapsulating a display unit DU. For example, the second substrate SUB2 may be a rigid substrate. The second substrate SUB2 may include a glass material or a metallic material, but the present disclosure is not limited thereto. In another example, the second substrate SUB2 may include an insulating material such as a polymer resin (e.g., PI).

The color filter layer CFL may be disposed on the second substrate SUB2. The color filter layer CFL may include a third buffer layer BF3, a plurality of touch electrodes SEN, an insulating film SIL, a color filter CF, a light-transmitting unit LTU, and a light-blocking member BK.

The third buffer layer BF3 may be disposed on the second substrate SUB2. The third buffer layer BF3 may have an insulating function and an optical function. The third buffer layer BF3 may include at least one inorganic film. Optionally, the third buffer layer BF3 may not be provided.

The touch electrodes SEN may be disposed on the third buffer layer BF3. The touch electrodes SEN may not overlap with a plurality of emission areas EA. The touch electrodes SEN may transmit light of a particular wavelength range therethrough. The touch electrodes SEN may be transparent electrodes including a transparent conductive material.

The insulating film SIL may be disposed on the touch electrodes SEN and the third buffer layer BF3. The insulating film SIL may have an insulating function and an optical function.

The color filter CF may be disposed on the insulating film SIL to correspond to the emission area EA of a pixel SP. The color filter CF may transmit light emitted from the pixel SP therethrough. The color filter CF may absorb some of light introduced from outside a display device 10 and may thus reduce reflected light from external light. Thus, the color filter CF can prevent color distortion that may be caused by the reflection of external light.

The light-transmitting unit LTU may be disposed on the insulating film SIL to correspond to a code pixel CPX. The light-transmitting unit LTU may transmit IR light emitted from the code pixel CPX therethrough. The light-transmitting unit LTU may absorb some of light introduced from outside the display device 10 and may thus reduce reflected light from external light. Thus, the light-transmitting unit LTU can prevent color distortion that may be caused by the reflection of external light.

The light-blocking member BK may be disposed in light-blocking areas BA, on the insulating film SIL. The light-blocking member BK may overlap with the pixel-defining film PDL in a thickness direction. The light-blocking member BK may prevent light from infiltrating between the emission areas EA and can thus improve the color reproducibility of the display device 10.

Figure 17:
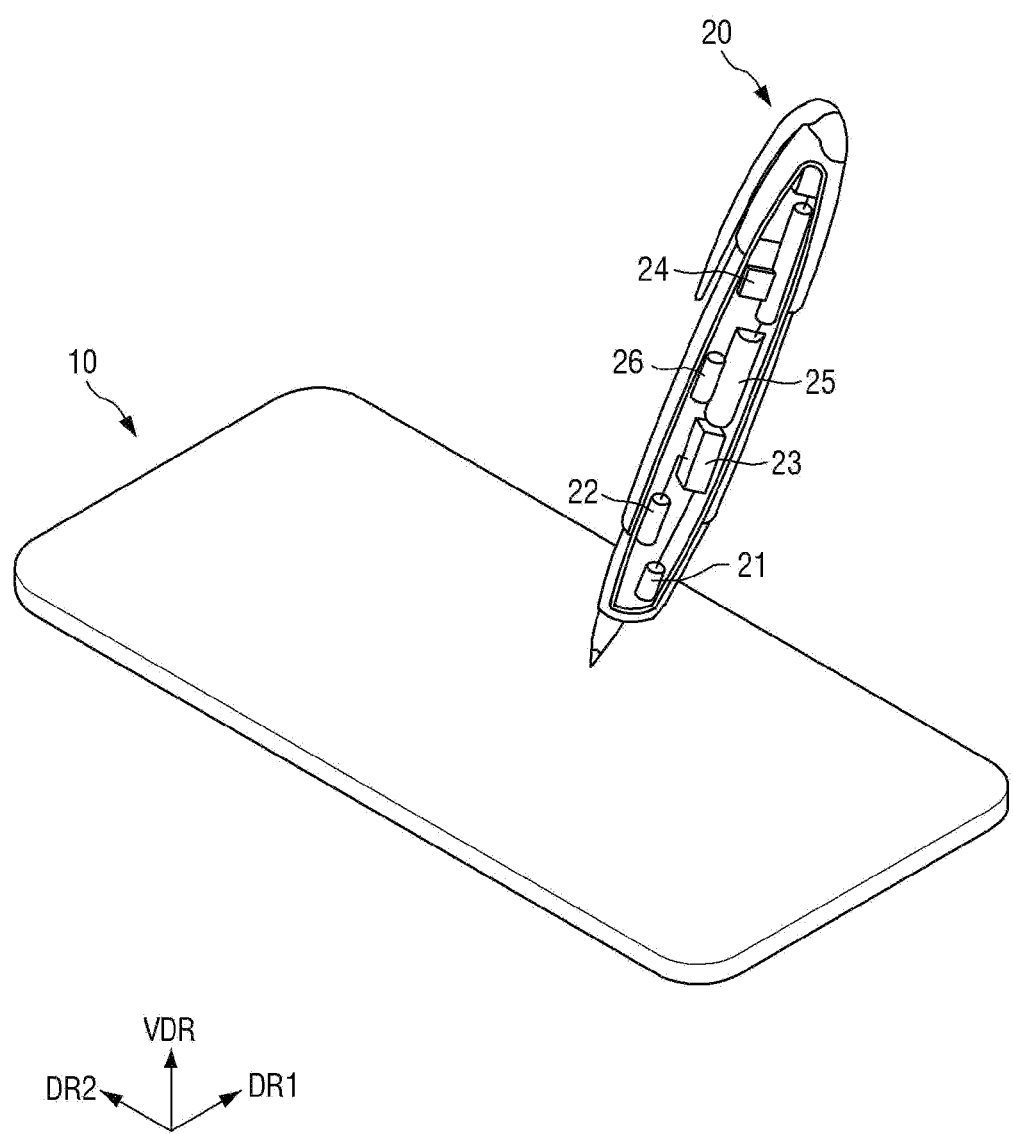
FIG. 17 is a perspective view of a sensing system according to an embodiment of the present disclosure.
Figure 18:
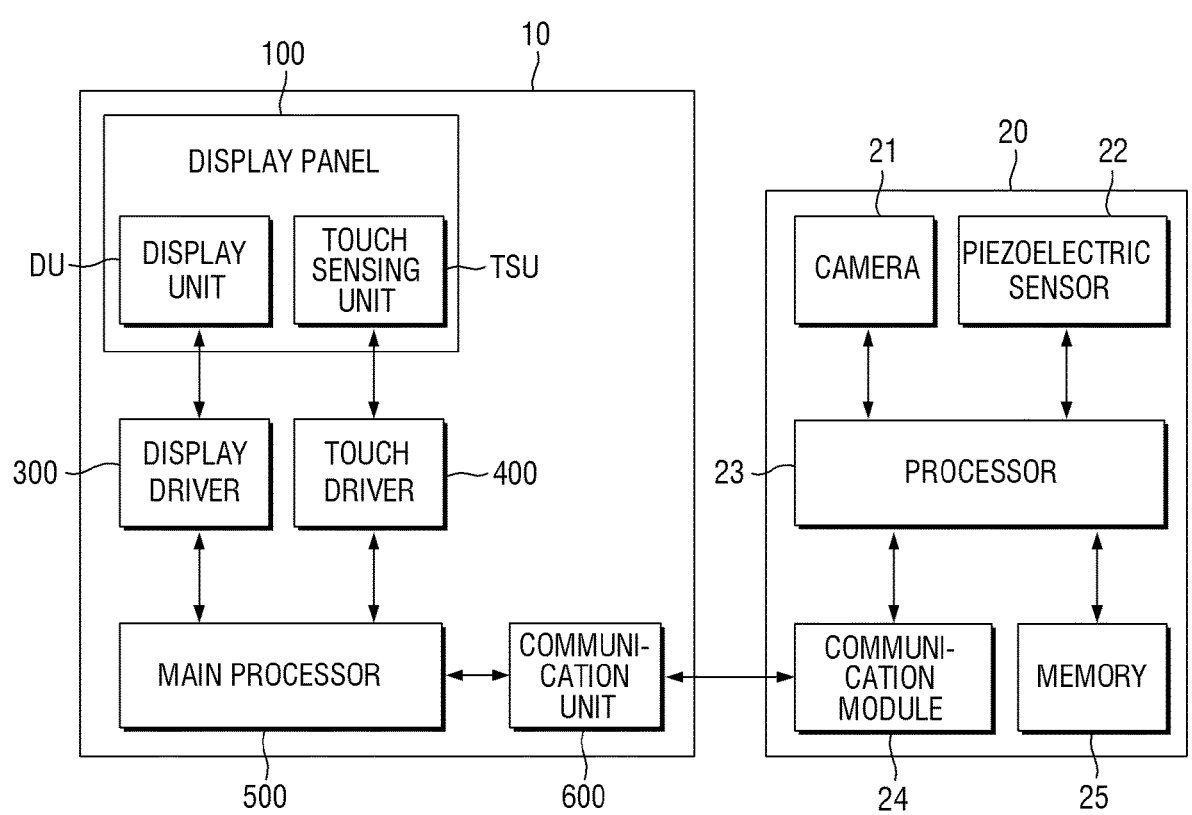
FIG. 18 is a block diagram of the sensing system of FIG. 17.

FIG. 17 is a perspective view of a sensing system according to an embodiment of the present disclosure, and FIG. 18 is a block diagram of the sensing system of FIG. 17.

Referring to FIGS. 17 and 18, the sensing system may include a display device 10 an input device 20.

The display device 10 may include a display panel 100, a display driver 300, a touch driver 400, a main processor 500, and a communication unit 600.

The display panel 100 may include a display unit DU and a touch sensing unit TSU. The display unit DU may include a plurality of pixels SP and may thus display an image. The display unit DU may also include a plurality of code pixels CPX and may thus form a code pattern having position information.

The code pixels CPX may emit IR light, but the present disclosure is not limited thereto. The code pixels CPX may be arranged over an entire display area DA. Each of the code pixels CPX may have position information in accordance with a predetermined set of criteria. An image of the code pixels CPX may be photographed by a camera 21 near the front of the display device 10, and the code pixels CPX may be identified from the photographed image. At least one code pixel CPX or a combination of code pixels CPX may correspond to a predetermined data code. For example, a code pixel CPX at a particular position may correspond to a data code designated for the particular position.

The touch sensing unit TSU may include a plurality of touch electrodes SEN and may sense touch input from a user in a capacitive manner.

The display driver 300 may output signals and voltages for driving the display unit DU. The display driver 300 may provide data voltages to data lines. The display driver 300 may provide power supply voltages to power supply lines and may provide gate control signals to a gate driver (not illustrated).

The touch driver 400 may be connected to the touch sensing unit TSU. The touch driver 400 may provide driving signals to the touch electrodes SEN of the touch sensing unit TSU and may sense capacitance variations between the touch electrodes SEN. The touch driver 400 may sense and calculate the presence and the coordinates of touch input from the user based on capacitance variations between the touch electrodes SEN.

The main processor 500 may control all the functions of the display device 10. For example, the main processor 500 may provide digital video data to the display driver 300 so that the display panel 100 may display an image. For example, the main processor 500 may receive touch data from the touch driver 400, may determine input coordinates from the user, and may either generate digital video data corresponding to the input coordinates or execute an application corresponding to an icon displayed at the input coordinates. In another example, the main processor 500 may receive coordinate data from the input device 20, may determine input coordinates of the input device 20 based on the coordinate data, and may either generate digital video data corresponding to the input coordinates or execute an icon displayed at the input coordinates.

The communication unit 600 may communicate with an external device in a wired or wireless manner. For example, the communication unit 600 may transmit communication signals to, or receive communication signals from, a communication module 24 of the input device 20. The communication unit 600 may receive coordinate data consisting of data codes from the input device 20 and may provide the coordinate data to the main processor 500.

The input device 20 may enter data by accessing, or being placed in contact with, the display device 10. The input device 20 may include the camera 21, a piezoelectric sensor 22, a processor 23, a communication module 24, a memory 25, and a battery 26. For example, the input device 20 may be an input pen capable of generating coordinate data in an optical manner. The input pen may be a smart pen, an electromagnetic pen, or an active pen, but the present disclosure is not limited thereto.

The camera 21 may be disposed at the front of the input device 20. The camera 21 may photograph an image of the code pixels CPX, which emit IR light. The camera 21 may continue to photograph images of the code pixels CPX in accordance with the movement of the input device 20. The camera 21 may provide the photographed image(s) to the processor 23.

The piezoelectric sensor 22 may sense pressure applied by the input device 20 to the display device 10. The piezoelectric sensor 22 may provide pressure information of the input device 20 to the processor 23.

The processor 23 may receive an image of the code pixels CPX from the camera 21. The processor 23 may convert the code pixels CPX into data codes and may generate coordinate data by combining the data codes. The processor 23 may transmit the coordinate data to the display device 10 through the communication module 24.

As the processor 23 receives an image of the code pixels CPX and converts at least one code pixel CPX or a combination of code pixels CPX into a data code, the sensing system can quickly generate coordinate data without a requirement of any complicated computation/correction process, can perform a function corresponding to exact input coordinates, can reduce cost and power consumption, and can simplify its driving process. Also, as the sensing system includes the code pixels CPX, which are disposed in the same layer as the pixels SP, the sensing system can be applied to nearly all types of electronic devices without any size limitations.

The communication module 24 may perform wired/wireless communication with an external device. For example, the communication module 24 may transmit communication signals to, or receive communication signals from, the communication unit 600 of the display device 10. The communication module 24 may receive coordinate data consisting of data codes from the processor 23 and may provide the coordinate data to the communication unit 600.

The memory 25 may store data necessary for driving the input device 20. As the input device 20 can convert at least one code pixel CPX or a combination of code pixels CPX into a data code and can readily provide coordinate data to the display device 10, a memory 25 with a relatively small storage capacity can be provided in the sensing system.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A display device comprising:
   a plurality of pixels including light-emitting elements, the light-emitting elements operable to display an image; and
   a plurality of code pixels disposed in a same layer as the pixels, adjacent to a reference point disposed between the pixels, the code pixels including infrared light-emitting elements, the infrared light-emitting elements operable to emit infrared light,
   wherein in operation at least one of the code pixels, disposed in a particular direction from the reference point, emits the infrared light to provide a code pattern having position information.

2. The display device of claim 1, wherein the reference point corresponds to an intersection between a first reference line extending in a first direction between the pixels, and a second reference line extending in a second direction intersecting the first direction between the pixels.

3. The display device of claim 2, wherein the code pixels comprise:
   a first code pixel disposed in the first direction from the reference point;
   a second code pixel disposed in the second direction from the reference point;
   a third code pixel disposed in a third direction opposite to the first direction from the reference point; and
   a fourth code pixel disposed in a fourth direction opposite to the second direction from the reference point, and
   wherein in operation at least one of the first, second, third, and fourth code pixels emits the infrared light to provide the position information corresponding to a predefined data code.

4. The display device of claim 1, wherein the pixels include first, second, and third pixels sequentially arranged in the first direction, and
   the reference point corresponds to an intersection between a first reference line extending in the first direction adjacent to the first, second, and third pixels, and a second reference line overlapping the second pixel and extending in a second direction intersecting the first direction.

5. The display device of claim 4, wherein the code pixels comprise:
   a first code pixel disposed in the first direction from the reference point;
   a second code pixel disposed in the second direction from the reference point;
   a third code pixel disposed in a third direction opposite to the first direction from the reference point; and
   a fourth code pixel disposed in a fourth direction opposite to the second direction from the reference point, and
   wherein in operation at least one of the first, second, third, and fourth code pixels emits the infrared light to provide the position information corresponding to a predefined data code.

6. The display device of claim 5, wherein the first code pixel overlaps with the third pixel in the second direction, the second and fourth code pixels overlap with the second pixel in the second direction, and
   the third code pixel overlaps with the first pixel in the second direction.

7. The display device of claim 1, wherein the pixels include first, second, and third pixels sequentially arranged in the first direction, and
   the reference point corresponds to an intersection between a first reference line extending in the first direction adjacent to the first, second, and third pixels, and a second reference line overlapping the first pixel and extending in a second direction intersecting the first direction.

8. The display device of claim 7, wherein the code pixels comprise:
   a first code pixel disposed in a fifth direction between the first and second directions from the reference point;
   a second code pixel disposed in a sixth direction between the second direction and a third direction opposite the first direction from the reference point;
   a third code pixel disposed in a seventh direction opposite to the third direction from the reference point; and
   a fourth code pixel disposed in an eighth direction opposite to the sixth direction from the reference point, and
   wherein in operation at least one of the first, second, third, and fourth code pixels emits the infrared light to provide the position information corresponding to a predefined data code.

9. The display device of claim 8, wherein the first and fourth code pixels overlap with the second pixel in the second direction, and
the second and third code pixels overlap with none of the first, second, and third pixels in the second direction.

10. The display device of claim 7, wherein the code pixels comprise:
a first code pixel disposed in the first direction from the reference point;
a second code pixel disposed in the second direction from the reference point;
a third code pixel disposed in a third direction opposite to the first direction from the reference point;
a fourth code pixel disposed in a fourth direction opposite to the second direction from the reference point;
a fifth code pixel disposed in a fifth direction between the first and second directions from the reference point;
a sixth code pixel disposed in a sixth direction between the second direction and the third direction from the reference point;
a seventh code pixel disposed in a seventh direction opposite to the fifth direction from the reference point; and
an eighth code pixel disposed in an eighth direction opposite to the sixth direction from the reference point, and
wherein in operation some of the first, second, third, fourth, fifth, sixth, seventh, and eighth code pixels emit the infrared light to provide the position information corresponding to a predefined data code.

11. The display device of claim 10, wherein the first, fifth, and eighth code pixels overlap with the second pixel in the second direction,
the second and fourth code pixels overlap with the first pixel in the second direction, and
the third, sixth, and seventh code pixels overlap with none of the first, second, and third pixels in the second direction.

12. A display device comprising:
a first substrate;
a thin-film transistor layer disposed on the first substrate and including thin-film transistors and switching transistors;
a plurality of light-emitting elements disposed on the thin-film transistor layer, connected to the thin-film transistors, and displaying an image; and
a plurality of infrared light-emitting elements disposed in the same layer as the light-emitting elements, connected to the switching transistors, and operable to emit infrared light,
wherein the infrared light-emitting elements are adjacent to a reference point, the reference point is disposed between the light-emitting elements, and
in operation at least one of the infrared light-emitting elements, disposed in a particular direction from the reference point, emits the infrared light to provide a code pattern having position information.

13. The display device of claim 12, wherein the infrared light-emitting elements include at least one of a metal complex compound, a donor-acceptor-donor compound, and a lanthanide compound, and
the infrared light-emitting elements have an emission spectrum of 800 nm or greater.

14. The display device of claim 12, wherein the thin-film transistors comprise:
a first transistor controlling a driving current flowing in the light-emitting elements;

a second transistor supplying a data voltage a first node, the first node is a source electrode of the first transistor;
a third transistor connecting second and third nodes, the second node is a drain electrode of the first transistor and the third node is a gate electrode of the first transistor;
a fourth transistor supplying an initialization voltage to the third node;
a fifth transistor connected between a driving voltage line and the first transistor;
a sixth transistor connected between the first transistor and the light-emitting elements; and
a seventh transistor supplying the initialization voltage to anodes of the light-emitting elements.

15. The display device of claim 14, wherein the switching transistors are turned on by gate signals to supply driving voltages to the infrared light-emitting elements.

16. The display device of claim 12, further comprising:
a second substrate disposed on the light-emitting elements and the infrared light-emitting elements; and
a plurality of touch electrodes disposed on the second substrate to sense touch input.

17. The display device of claim 16, further comprising:
color filters disposed on the touch electrodes and overlapping with the light-emitting elements; and
light-transmitting units disposed in the same layer as the color filters and overlapping with the infrared light-emitting elements.

18. The display device of claim 12, further comprising:
an encapsulation layer disposed on the light-emitting elements and the infrared light-emitting elements; and
a plurality of touch electrodes disposed on the encapsulation layer to sense touch input, the touch electrodes surround the light-emitting elements and the infrared light-emitting elements in a plan view.

19. A sensing system comprising:
a display device operable to display an image; and
an input device operable to make an input by approaching or touching the display device,
wherein the display device comprises:
a plurality of pixels including light-emitting elements operable to display the image; and
a plurality of code pixels disposed in a same layer as the pixels, adjacent to a reference point disposed between the pixels, and including infrared light-emitting elements emitting infrared light,
wherein in operation at least one of the code pixels, disposed in a particular direction from the reference point, emits the infrared light to provide a code pattern having position information, and
the input device photographs an image of the code pixels, converts the code pixels into predetermined data codes, and transmits coordinate data comprised of the predetermined data codes to the display device.

20. The sensing system of claim 19, wherein the input device comprises:
a camera operable to photograph the image of the code pixels;
a processor operable to convert the code pixels into the predetermined data codes by analyzing the photographed image of the code pixels and generating coordinate data comprised of the predetermined data codes; and
a communication module operable to transmit the coordinate data to the display device.

* * * * *